US007323877B2

(12) United States Patent
Waymouth et al.

(10) Patent No.: US 7,323,877 B2
(45) Date of Patent: Jan. 29, 2008

(54) APPARATUS AND METHODS FOR MAKING SPECTROSCOPIC MEASUREMENTS OF CATHODE FALL IN FLUORESCENT LAMPS

(75) Inventors: John Francis Waymouth, Marblehead, MA (US); Robert Thomas Nachtrieb, Lansdale, PA (US); Farheen Khan, Coopersburg, PA (US); Mark Alan Hartfield, Saint Joseph, MI (US); Mark Stephen Taipale, Harleysville, PA (US); Renzo Corrado DeMeo, Huntington, NY (US); Russell Lawrence MacAdam, Coopersburg, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 0 days.

(21) Appl. No.: 11/507,159

(22) Filed: Aug. 21, 2006

(65) Prior Publication Data

US 2006/0279224 A1 Dec. 14, 2006

Related U.S. Application Data

(62) Division of application No. 10/818,664, filed on Apr. 6, 2004, now Pat. No. 7,116,055.

(51) Int. Cl.
*G01R 31/00* (2006.01)

(52) U.S. Cl. ...................................... 324/414; 324/122

(58) Field of Classification Search .................. 315/94, 315/149, 150; 324/403, 414, 122
See application file for complete search history.

(56) References Cited

U.S. PATENT DOCUMENTS

| | | | | |
|---|---|---|---|---|
| 4,638,215 A | | 1/1987 | Schmid et al. | 315/3.5 |
| 4,751,426 A | | 6/1988 | Hoffman et al. | 313/487 |
| 5,103,133 A | * | 4/1992 | Misono | 313/491 |
| 5,367,223 A | | 11/1994 | Eccher | 315/97 |
| 5,424,611 A | * | 6/1995 | Moriarty, Jr. | 315/94 |
| 5,475,284 A | * | 12/1995 | Lester et al. | 315/209 R |
| 5,703,441 A | | 12/1997 | Steigerwald et al. | 315/307 |
| 5,834,908 A | | 11/1998 | Boland et al. | 315/307 |
| 5,952,832 A | | 9/1999 | Stevanovic et al. | 324/414 |
| 6,243,017 B1 | * | 6/2001 | Kuisma | 340/641 |
| 6,538,448 B1 | * | 3/2003 | Tabell | 324/414 |
| 6,583,573 B2 | | 6/2003 | Bierman | 315/149 |
| 6,693,944 B1 | | 2/2004 | Hug et al. | 372/88 |
| 6,864,685 B2 | | 3/2005 | Otsuka et al. | 324/410 |
| 2004/0100194 A1 | | 5/2004 | Eden, et al. | 313/538 |
| 2005/0012468 A1 | | 1/2005 | Ryu et al. | 315/274 |

OTHER PUBLICATIONS

Hammer, E.E., "Cathode Fall Relationship in Fluorescent Lamps", *IESNA Conference, Miami Beach FL*, 1994, (Published Version)- JIES Winter 1995, 116-122.

Hammer, E.E., "Comparative Starting-Operating Characteristics in Typical F40 Systems", *IESNA Conference Minneapolis MN*, 1988, (Published version)- JIES Winter 1989, 63-69.

Ligthart, F.S. et al., 5th *International Symposium on Science and Technology of Light Sources*, 1989, Paper 17L, York England.

Waymouth, J.F., "Electric Discharge Lamps", 1971, *Mit Press*, Chapter IV, 70-113 and Appendix B, "Probe Measurements in Plasmas", 338-345.

* cited by examiner

*Primary Examiner*—Thuy Vinh Tran
(74) *Attorney, Agent, or Firm*—Woodcock Washburn LLP

(57) ABSTRACT

Apparatus and methods are disclosed for measuring cathode fall within a fluorescent lamp that contains an electrode and a gas. A level of cathode fall associated with the electrode may be identified based on an intensity and wavelength of radiation emitted by the gas.

20 Claims, 27 Drawing Sheets

ARGON ENERGY LEVEL DIAGRAM

APPARATUS AND METHODS FOR MAKING SPECTROSCOPIC MEASUREMENTS OF CATHODE FALL IN FLUORESCENT LAMPS

CROSS-REFERENCE TO RELATED APPLICATIONS

This application is a division of U.S. patent application Ser. No. 10/818,664, filed Apr. 6, 2004, which is now U.S. Pat. No. 7,116,055.

The subject matter disclosed and claimed herein is related to the subject matter disclosed and claimed in U.S. patent application Ser. No. 10/818,667, filed on even date herewith, entitled "Apparatus And Methods For Making Capacitive Measurements Of Cathode Fall In Fluorescent Lamps."

The disclosure of each of the above-referenced patent applications is incorporated herein by reference in its entirety.

FIELD OF THE INVENTION

Generally, the invention relates to measuring cathode fall in fluorescent lamps. More particularly, the invention relates to apparatus and methods for making spectroscopic measurements of cathode fall in fluorescent lamps.

BACKGROUND OF THE INVENTION

Typical fluorescent lamps contain electrodes that, when operated at the lamp's rated discharge current, are heated to cause thermionic emission of electrons. Such lamps typically contain two electrodes. Each electrode serves as an anode during a first half-cycle of the alternating current (AC) provided to the electrodes, while the other electrode serves as cathode. During the subsequent half-cycle, the electrodes swap roles. Thus, each electrode serves as cathode and anode on alternating half-cycles.

Such fluorescent lamps may be dimmed by reducing the current supplied to the electrodes. Reducing the current, however, also reduces the electrode temperature. If the cathode, for example, is not sufficiently hot, it may not have sufficient thermionic emission to maintain the discharge as a thermionic arc. Rather, it may be forced to operate in a "cold-cathode" (i.e., high cathode-fall, high sputtering) mode. The resulting sputtering damage may cause the cathode, and thus the lamp, to fail within a few hours. Less destructive, but equally fatal in the long run, is the fact that a not-quite-hot-enough cathode will have a higher-than-normal cathode fall even though the cathode continues to operate in the thermionic-arc mode. If the cathode fall exceeds the so-called "disintegration voltage" or "sputter voltage," incoming mercury ions bombard the cathode with sufficient energy to dislodge (i.e., "sputter") surface atoms, bringing about increased rate-of-loss of cathode coating and short life.

In order to avoid these effects in fluorescent lamp dimming, an auxiliary electrode heating current may be supplied to the electrode filament to heat the filament sufficiently, by Ohmic heating, to cause thermionic emission. At low dimming currents with minimal heating of the cathode from the discharge current, the auxiliary supply may be the only heat source available to maintain cathode temperature. The auxiliary supply maybe a low voltage, typically <6 volts, AC supply connected to the two ends of the filament structure holding the emissive coating. Resistive heating in the filament then furnishes the necessary heating power to maintain the cathode temperature at a desired level. The heating level and corresponding cathode temperature may be controlled by adjustments in the voltage or current furnished by the auxiliary heating power supply.

Obviously, the lower the dimming level at which the lamp is operated, the higher the auxiliary electrode heating current that will be required. If the voltage of the auxiliary heat supply is too low, then the cathode is too cold, the thermionic-arc cathode fall is too high, sputtering occurs with accelerated loss of cathode coating, and short lamp life results. Accordingly, it would be desirable to define a lower limit for the auxiliary electrode heating current in order to keep the lamp life within a reasonable range. On the other hand, if the voltage of the auxiliary heat supply is too high, the cathode temperature is too high, and excessive evaporation of cathode coating leads to short lamp life, even though the cathode fall is maintained well below the disintegration voltage. Steering a course between the Scylla and Charybdis perils represented by sputtering or excess evaporation is therefore desirable in selecting an appropriate cathode-heating-voltage profile as a function of discharge current. Such considerations may be particularly useful in the design of dimming ballasts.

By techniques known in the art, cathode temperature may be measured with an optical pyrometer, provided special lamps with phosphor wiped away from the ends are used to render the cathode visible. Alternatively, average cathode temperature may be determined in lamps without wiped ends by measuring the ratio of hot-to-cold-resistance of the cathode tungsten coil.

A technique is known for determining heater current as a function of discharge current in one particular lamp type of one particular wattage (see F. S. Ligthart, H. Ter Heyden, and L. Kastelein (Paper 17L, 5th International Symposium on Science and Technology of Light Sources, York, England 1989). This technique, however, involves life-testing a number of lamps at various values of heater current and discharge current for a long period of time. Examination of the resulting discolorations on the ends of the lamps could discriminate between sputtering, which may lead to so-called "end band" discoloration, excess evaporation, which may lead to so-called "cathode spotting" discoloration, and satisfactory heater voltage, which exhibits little or no discoloration.

FIG. 1 provides typical sputter and vaporization curves obtained using this technique. Heater-current versus lamp-current points where excessive evaporation was found are identified with a □; points where excessive sputtering was found are identified with a ○; points where neither excessive evaporation nor excessive sputtering were found are marked with an x. Points lying between the two curves may be considered acceptable. Points lying below the sputter curve may lead to sputtering. Points lying above the vaporization curve may lead to excessive evaporation.

Though such a technique may provide information that is useful in determining the correct heater-current profile versus dimming current, it is far too cumbersome for an electronic ballast manufacturer to employ efficiently. To provide comprehensive results, it would have to be repeated for every different wattage of every different lamp type. In addition, cathode designs employed by different lamp manufacturers for the same lamp type are different, requiring testing of a number of different versions of the same lamp type.

FIG. 2 provides a plot of cathode fall as a function of phase angle for a typical fluorescent lamp. Specifically, FIG. 2 shows cathode fall as a function of phase angle in a typical T12 Rapid Start fluorescent lamp operating at rated current and heater voltage. Measurements of cathode fall were made using special lamps equipped with so-called "Langmuir Probes" (see John F. Waymouth, "Electric Discharge Lamps," MIT Press 1971, Chapter IV and Appendix B). It should be understood that, as the data provided in FIG. 2 is on an absolute, rather than relative, basis, the plot of FIG. 2 provides a standard against which other methods for measuring cathode fall may be compared.

FIG. 3A provides a plot of cathode and anode falls for a typical fluorescent lamp. FIG. 3B provides a plot of arc current supplied to produce the cathode and anode falls plotted in FIG. 3A. Cathode fall in 60-Hz AC operated fluorescent lamps was measured via a method, attributable to Hammer, et al., wherein a capacitive probe, which may be a foil sheet, for example, is wrapped around a portion of the lamp that contains the electrode (see, for example, E. E. Hammer, "Comparative Starting Characteristics in Typical F40 Systems", Preprint, IESNA Conference Minneapolis Minn. 1988, and its published version, JIES Winter 1989, p 64; and E. E. Hammer, "Cathode Fall Relationships in Fluorescent Lamps", Preprint #69, IESNA Conference, Miami Beach Fla., 1994, and its published version, JIES, Winter 1995, p 116). The probe picks up fluctuations of plasma potential in proximity to the electrode, and presents them to an oscilloscope for detection. As the negative glow in front of the cathode is approximately an equipotential blob of high-density plasma at a potential (positive relative to the cathode) that is equal to the cathode fall, fluctuations of plasma potential on the cathode half cycle may be interpreted as the signature of fluctuations of cathode fall during the half cycle.

Positive swings of potential are attributed to cathode fall (negative glow plasma that is positive with respect to the electrode) while negative swings are identified with anode fall (negative glow plasma that is negative with respect to the electrode). When allowance is made for the difference in lamp-current waveform, the shape of the curve agrees well with that shown in FIG. 2. The jagged fluctuations seen in FIG. 3A on the anode half cycle are so-called "anode oscillations."

Because knowledge of cathode fall provides information that can be used to determine an acceptable range for auxiliary heater current/voltage to be supplied to the electrode, it would be desirable if apparatus and methods were available for determining whether cathode fall has exceeded a predetermined level. Together with a measurement of cathode temperature, such a technique would provide an unambiguous bracket for the acceptable range of cathode heater voltages and currents.

SUMMARY OF THE INVENTION

A method for measuring cathode fall within a fluorescent lamp that contains an electrode and a gas may include detecting radiation emitted from the gas and identifying a level of cathode fall associated with the electrode based on an intensity and wavelength of the detected radiation. Apparatus for measuring cathode fall in such a fluorescent lamp may include a radiation detector that receives radiation emitted from the gas and a display that provides a visual representation of an intensity of the received radiation, wherein the intensity of the received radiation corresponds to a level of cathode fall associated with the electrode.

The principles of the invention may be applied in the design of dimming ballasts, where it is desirable to determine an optimum value for current supplied to the electrode as a function of discharge current. A ballast designer may identify a range of cathode-heater voltages that may be supplied to the electrodes of a certain lamp (or lamp type) so that cathode fall does not exceed a level that would cause the lamp to fail even over a range of discharge currents. A dimming ballast could then be designed to cause the cathode-heater power supply to supply a cathode-heater voltage that would be within range for multiple lamp types. Ballast design could be optimized for rapid-start applications as well as for steady-state operation by identifying a preheat profile that results in the quickest relaxation of arc voltage and arc current to their steady-state values.

A ballast could be preprogrammed with respective steady-state trajectories and/or rapid-start heating profiles for each of a plurality of lamp types. The ballast could then be informed, during installation of the ballast or lamp, for example, of the lamp type that is coupled to the ballast. Similarly, a ballast could be designed to cause the cathode-heater power supply to dynamically provide a heater current (or voltage) that prevents the cathode fall from exceeding a threshold level.

The principles of the invention could also be applied to "audit" a lamp type for changes, such as filament changes. Similarly, a lamp designer could characterize a lamp type or filament type, without the need for life testing, by employing the principles of the invention. Such lamp performance data may then be published in connection with the lamp, such as by publication in a specification associated with the lamp (e.g., for warranty purposes).

BRIEF DESCRIPTION OF THE DRAWINGS

In the drawings, like numerals indicate like elements.

DETAILED DESCRIPTION OF ILLUSTRATIVE EMBODIMENTS

Figure 1:
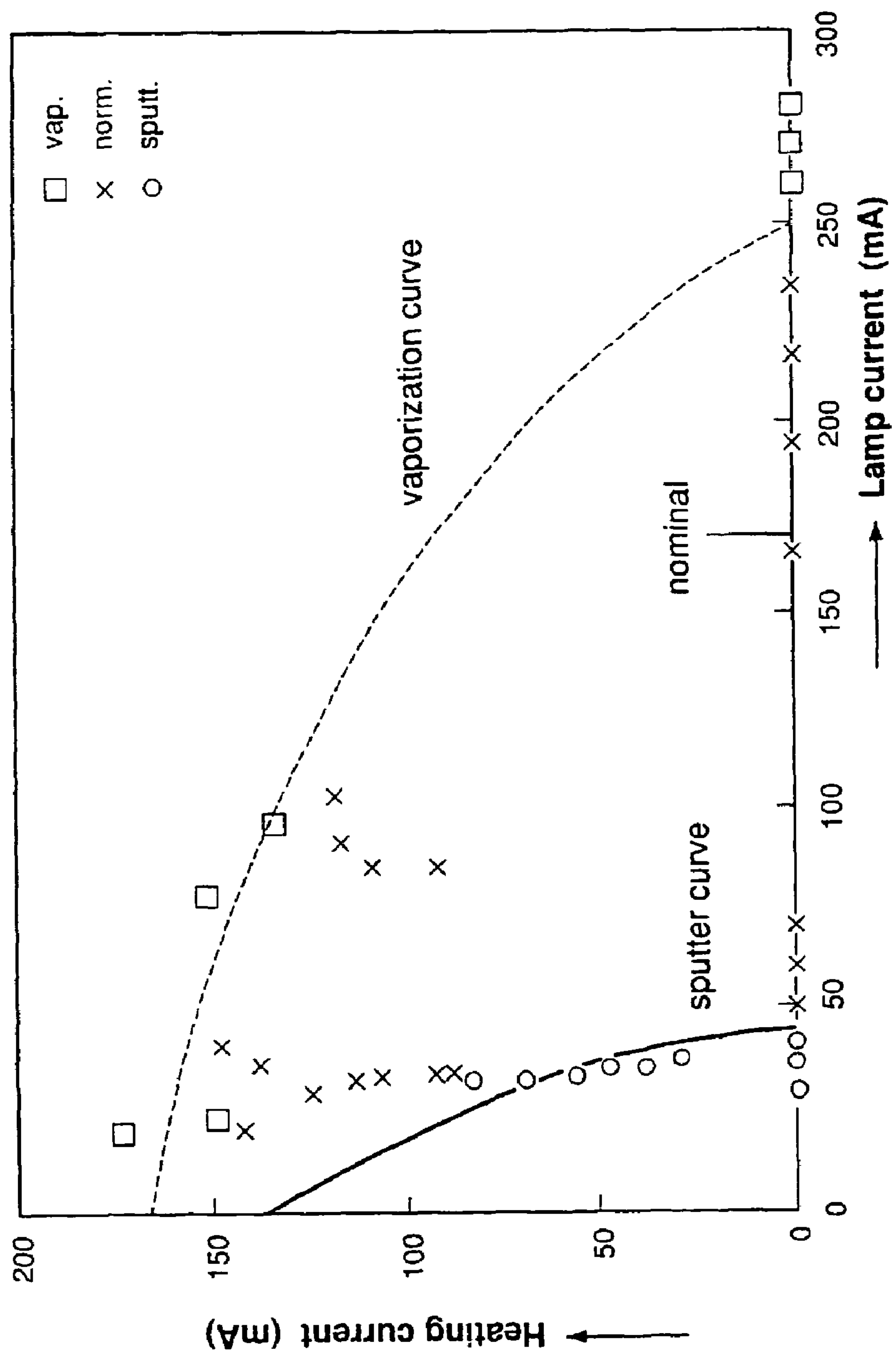
FIG. 1 (Prior Art)
FIG. 1 provides typical prior art sputter and vaporization curves.
Figure 2:
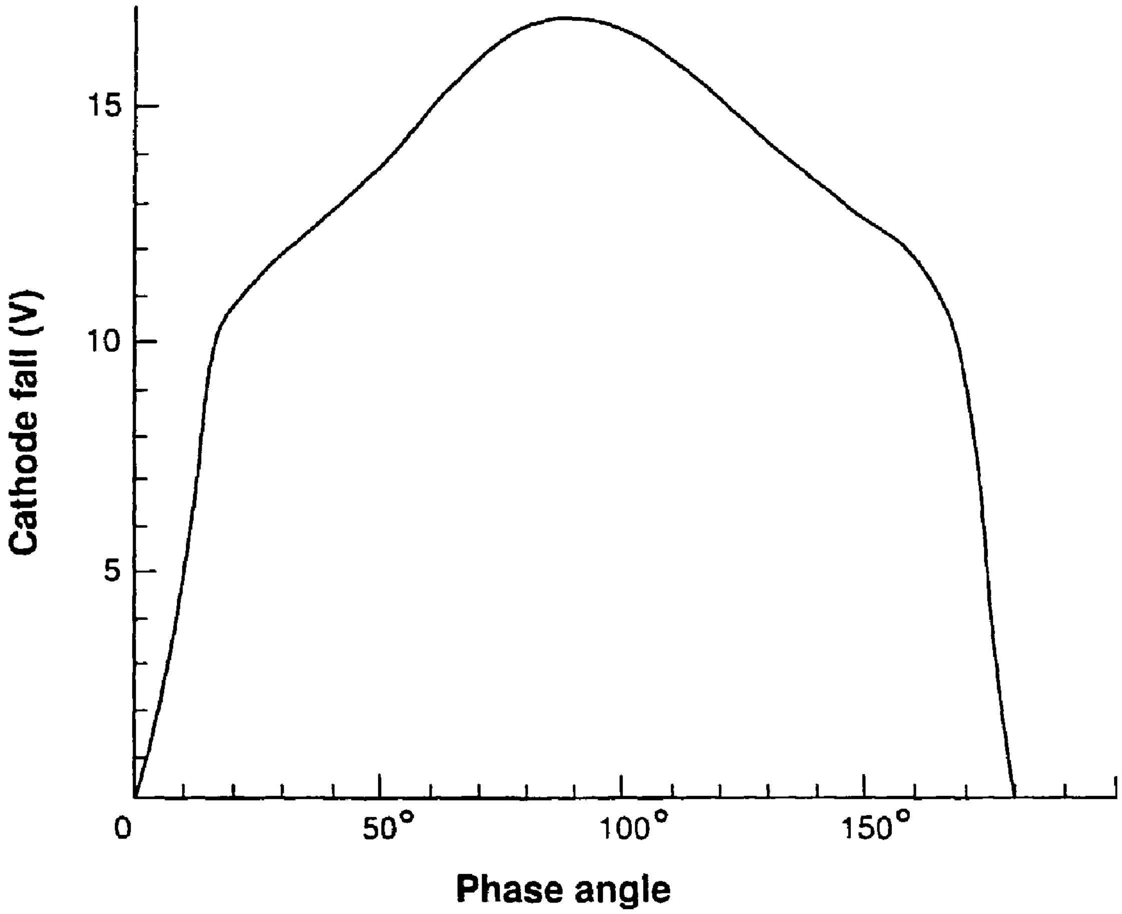
FIG. 2 (Prior Art)
FIG. 2 provides a prior art plot of cathode fall as a function of phase angle for a typical fluorescent lamp.
Figure 3A:
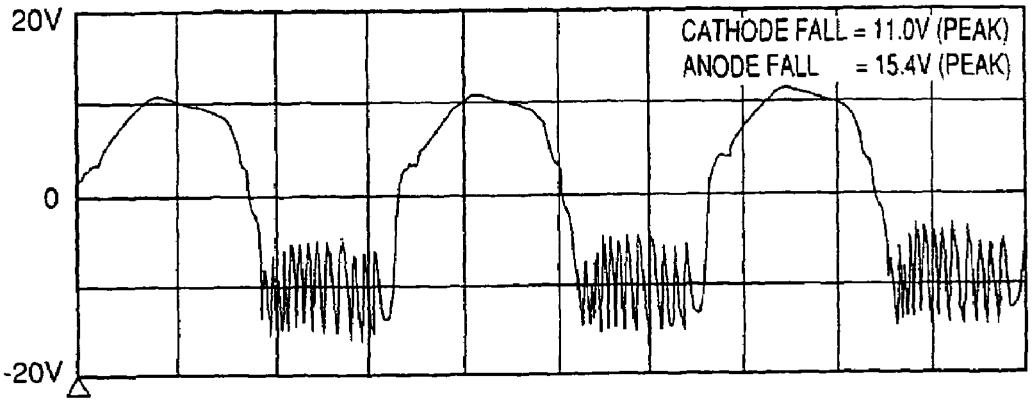
FIG. 3A (Prior Art)
FIG. 3A provides a prior art plot of cathode and anode falls for a typical fluorescent lamp.
Figure 3B:
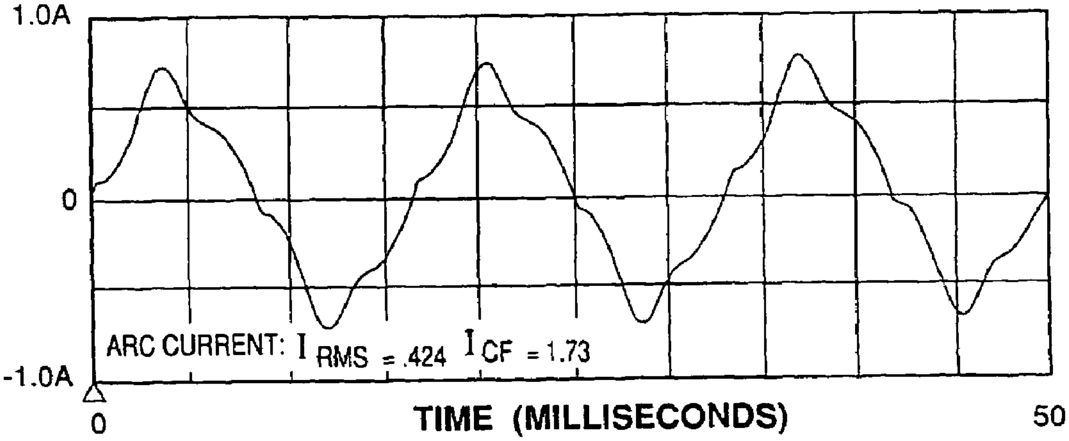
FIG. 3B (Prior Art)
FIG. 3B provides a prior art plot of arc current supplied to produce the cathode and anode falls plotted in FIG. 3A.
Figure 4:
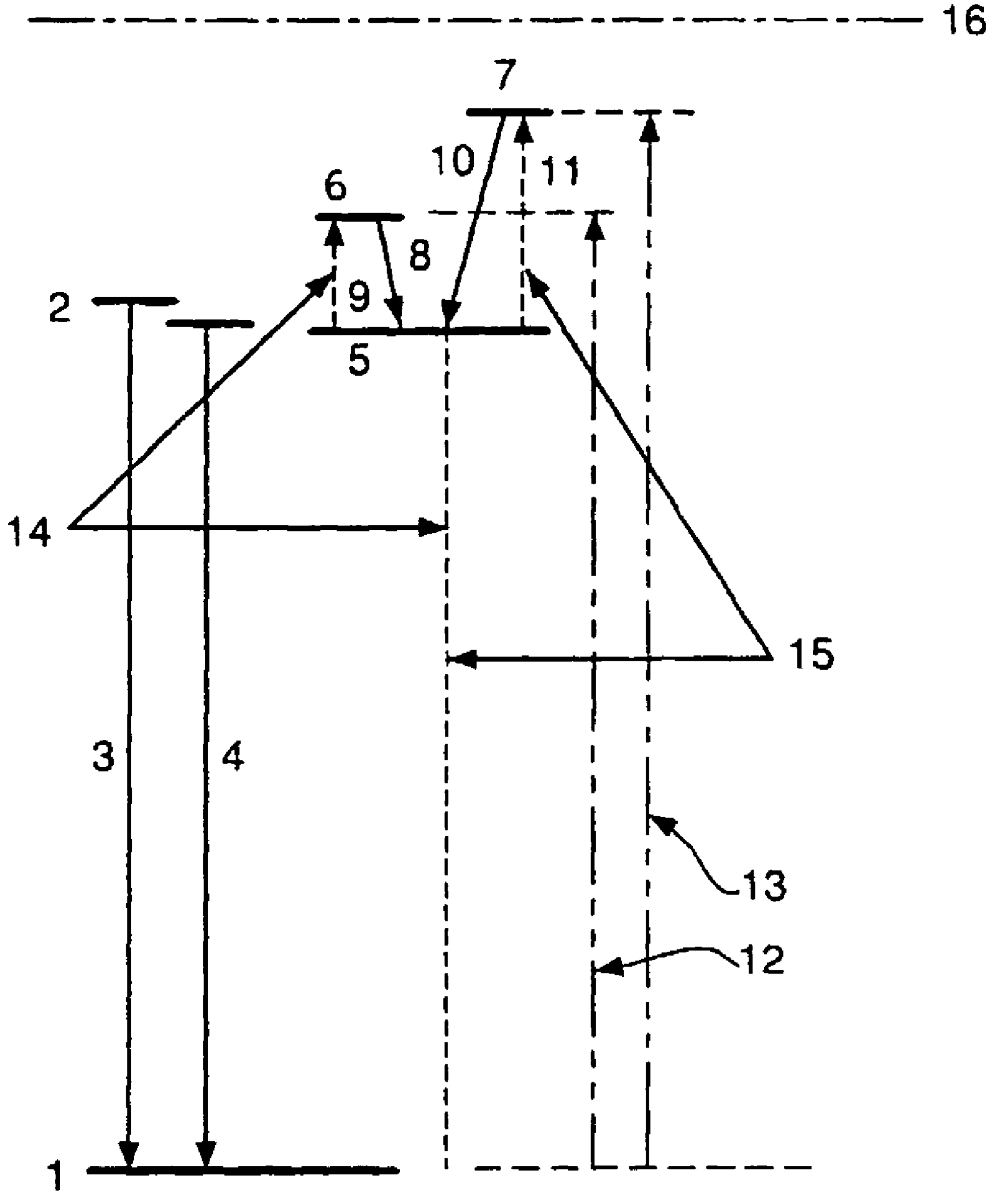
FIG. 4 is an energy level diagram.

FIG. 4 is an energy level diagram showing example energy levels of an argon atom. It should be understood that argon is discussed herein for purposes of illustration only, and that the gas contained in the fluorescent lamp may be any gas, though a rare gas such as helium, neon, argon, krypton, or xenon, for example, will typically be used.

For argon, 4s states 2A, 2B exist at approximately 11.63 and 11.83 ev, respectively, above the ground state 1. The 4s states 2A, 2B may be excited from the ground state 1 by the impact of electrons having energy that is greater than the corresponding energy levels associated with the 4s states 2A, 2B. An optical transition 3 to the ground state 1 from the upper 4s state 2A results in the emission of radiation having a wavelength of about 104.8 nm. Similarly, an optical transition 4 to the ground state 1 from the lower 4s state 2B results in the emission of radiation having a wavelength of about 106.7 nm.

A metastable energy level 5 exists at approximately 11.55 ev above the ground state 1. The metastable energy level 5 may be excited from the ground state 1 by impact of an electron of higher energy. Radiation from the metastable state 5 to the ground state 1, however, is optically forbidden by selection rules. Once excited to the metastable state 5, argon atoms remain there until a second collision transfers them to another state. An example of such a second collision is a so-called "Penning" collision between a metastable argon atom and a ground state mercury atom, for example. As a result of such a Penning collision, the argon atom returns to the ground state 1 and the mercury atom is ionized. This reaction is responsible for ionization in the negative glow, which supplies ion current to the cathode in thermionic arc operation.

Another type of collision is that of a second, lower-energy electron that excites the metastable atom to a higher-lying energy state. A first such collision 9 may excite the atom to a 4p state 6, which is approximately 13.08 ev above the ground state 1. A second such collision 11 may excite the atom to a 5p state 7, which is approximately 14.50 ev above the ground state 1. Thus, the 4p state 6 and 5p state 7 may be excited stepwise 14, 15, respectively, from the ground state 1 via the metastable state 5. An optical transition 8 from the 4p state 6 to the metastable state 5 results in the emission of an infrared spectral line at about 811.5 nm. An optical transition 10 from the 5p state 7 to the metastable state 5 results in the emission of a visible spectral line at about 420.0 nm.

The 4p state 6 may also be excited directly 12 from the ground state 1 in collisions by electrons of greater energy than 13.08 ev. Similarly, the 5p state 7 may be excited directly 13 from the ground state 1 in collisions by electrons of greater energy than 14.5 ev. Once excited to states 6 and 7 by any path, direct or stepwise, the atoms radiate, within nanoseconds, the spectral lines 811.5 nm or 420.0 nm, respectively.

The great majority of electrons in the negative glow plasma are "secondary" electrons, produced by ionization of mercury. These electrons have enough energy to perform the second-stage excitation of the two-stage excitation process, but not enough to directly excite from the ground state the energy levels at 11.55v, 13.08v, or 14.50v. Excitation of these states is by so-called "primary" electrons emitted from the cathode and accelerated through the cathode fall sheath. As the cathode fall sheath is thin in comparison to a mean free path of the electrons, the electrons make no collisions in the sheath and enter the negative glow with the full energy of the cathode fall. Therefore, as we have discovered, the onset of excitation of any of these levels is a signal that the cathode fall has exceeded the corresponding excitation potential.

We have further discovered that under conditions that are typical in fluorescent lamps, 420.0 nm radiation is primarily excited via the stepwise process 15, whereas the 811.5 nm line is primarily excited directly from the ground state via the direct process 12. We have also discovered that excitation of level 7 by lower energy electrons from the metastable level 5 is rapid, occurring within a very brief time (relative to the duration of discharge current cycle) after the creation of the metastable atom. Emission of either 420.0 nm or 811.5 nm radiation also occurs promptly after excitation regardless of path. Thus, we have discovered that the emission of radiation of a certain, known wavelength is a signal that cathode fall has exceeded the excitation potential of the corresponding state.

The time dependence of the emission of 420.0 nm and of 811.5 nm radiation from the negative glow immediately adjacent to the cathode was measured. The onset of emission of 420 nm radiation indicates that the cathode fall has exceeded the metastable energy of 11.55 volts and that stepwise excitation 15 is proceeding. The later onset of emission of 811.5 nm radiation indicates that the cathode fall has exceeded the energy of the 4p state 6, i.e., 13.08 volts, thereby permitting direct excitation 12 to take place. In some cases, a second onset was detected in the emission of 420.0 nm radiation, thus signaling that the cathode fall has exceeded 14.5 volts and direct excitation of the 5p state 7 from the ground state 1 is also occurring. Thus, the presence of these radiations may be used to determine the phase angles at which cathode fall exceeds 11.55 volts, 13.08 volts, and 14.5 volts, respectively.

In some cases, 811.5 nm radiation may also be excited stepwise via the metastable state 5. This situation may be recognized in that it results in the onset of both 420 nm and 811.5 nm radiations at the same phase angle and the same value of cathode fall. This condition has been found to occur at low mercury vapor pressure, which reduces the rate of destruction of argon metastable atoms by Penning collisions with mercury and results in a higher concentration of metastable atoms to excite.

The cathode heater voltage (or current) at which the cathode fall drops below the corresponding excitation potential may be determined from the vanishing of emission of the corresponding radiation. Alternatively, information determined from these onsets of emission may be used to provide several points of absolute voltage calibration of a cathode/anode fall waveform measured capacitively. The inventive method may be employed using any operating frequency, such as an operating frequency as might be used by an electronic ballast, such as in the range of about 50 Hz to at least 25 kHz, for example.

Though the foregoing was discussed with reference to argon, other gases, such as helium, neon, krypton, and xenon, for example, would exhibit similar selected emission lines. Such gases may be present in addition to, or in place of, argon as a component of the gas filling in a fluorescent lamp. Alternatively, any one or more of these gases may be added in trace quantities to an argon-filled lamp specifically to permit such spectral measurements. For example, it may be useful to employ spectral lines of neon excited by a two-stage process via the metastable level at 16.67 ev. The cathode heater voltage or current at which the emission of such lines is at the peak of the lamp-current waveform would then be that for which cathode fall drops below 16.67 volts. Since cathode fall above 16 volts is commonly considered to be in the danger zone of sputtering, knowing what cathode heater voltage or current causes the cathode fall to remain below that level would be valuable information that may be used in the design of fluorescent lamps and dimming ballasts, for example, as well as for tools for field testing such lamps or ballasts.

Figure 5:
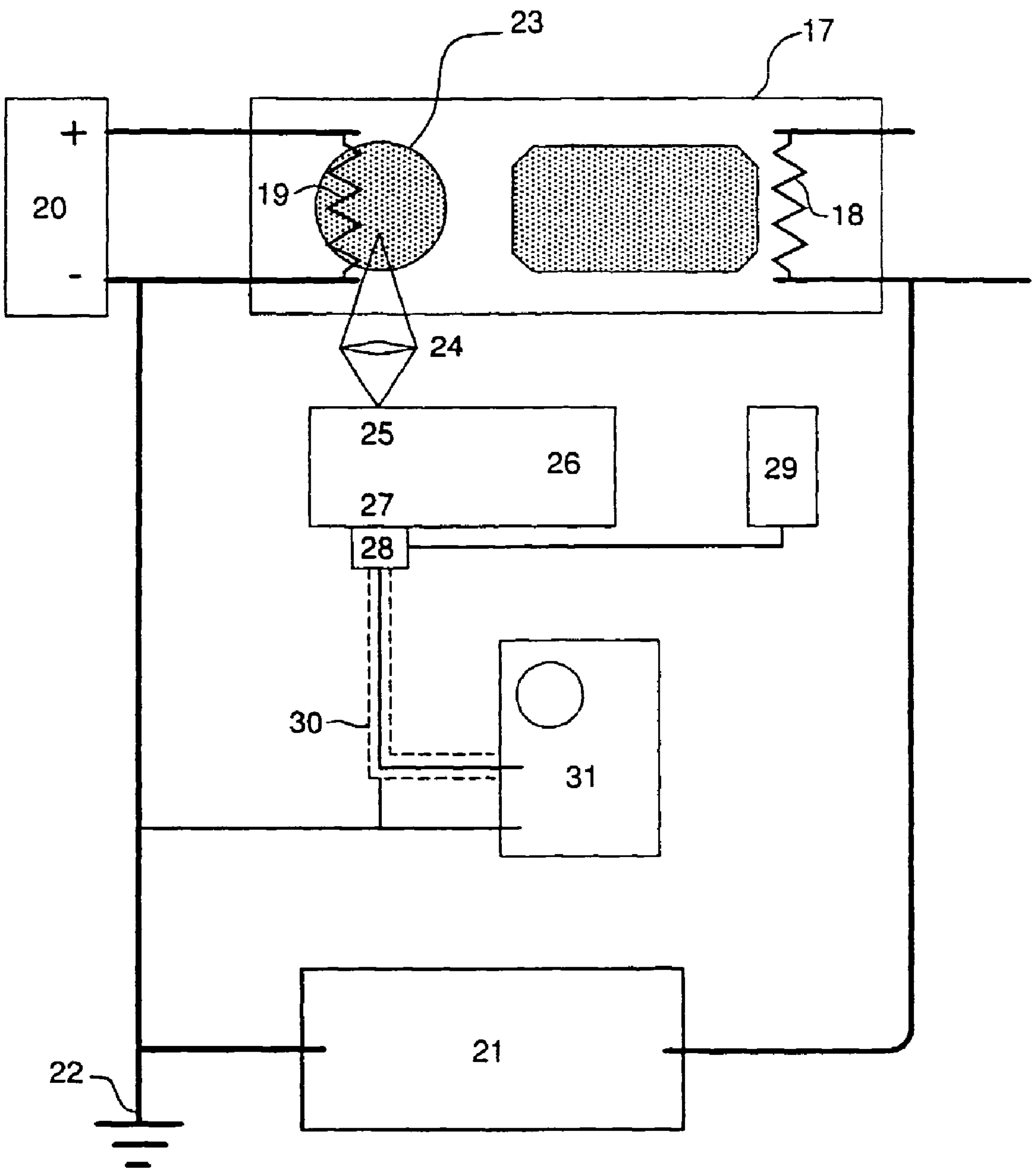
FIG. 5 is a block diagram of an example embodiment of apparatus according to the invention for measuring cathode fall.

FIG. 5 is a block diagram of an example embodiment of apparatus according to the invention that may be used for measuring cathode fall in a fluorescent lamp. As shown, a fluorescent lamp 17 may include a pair of electrodes 18 and 19. A power supply 20 provides a heater voltage, which may be of any waveform, to one of the electrodes (i.e., the electrode under test, e.g., electrode 19). A discharge lamp ballast 21 delivers discharge current, which may be of any waveform, to the lamp. Ballast 21 may be a dimming ballast, for example, such as any of a number of dimming ballasts that are known in the art.

During operation of the lamp, a negative glow 23 envelopes the electrode 19. Light from the negative glow may be collected by a lens 24, which is focused on a spectrometer entrance slit 25, and dispersed in wavelength by a spectrometer 26. A selected wavelength is isolated by the spectrometer at spectrometer output 27. It should be understood that, in general, any device capable of isolating radiation of a specific wavelength, specific wavelengths, or a specific range of wavelengths, such as a spectrometer, a grating polychrometer, a filter, or a prism, for example, may be used to provide the radiation having the selected wavelength.

The selected wavelength may be detected by a photomultiplier tube 28, which may be powered by a high voltage supply 29. It should be understood that, in general, any device that converts radiation intensity to a voltage with sufficiently quick time response, such as a photomultiplier tube or charge-coupled device, for example, may be used to detect the radiation having the selected wavelength.

The signal out of the photomultiplier 28 may be conducted through a shielded cable 30 to the input of an oscilloscope 31. The oscilloscope 31, power supplies 20, 29, the photomultiplier 28, and one terminal of the electrode-under-test 19 may be bonded to a common ground 22.

Preferably, the oscilloscope 31 is capable of signal averaging and other manipulations that may be desirable to improve signal-to-noise ratios. Further, it is preferred that the resistance-capacitance (RC) time constant of the oscilloscope input impedance times the capacitance of the shielded cable should be much less than the period of the detected signal waveform so that emission onset may be reliably detected. For high frequency discharge lamp operation (i.e., up to 50 kHz, for example), 50-ohm input impedance and signal averaging are preferred to obtain satisfactory signal-to-noise ratios.

The following figures provide data obtained using spectroscopic measurement apparatus and methods according to the invention. Cathode fall traces are provided for each of a number of operating conditions. The cathode fall traces were acquired using apparatus and methods for making capacitive measurements of cathode fall in fluorescent lamps, such as described and claimed in U.S. patent application Ser. No. 10/818,667. Traces of emission of 420 and 811.5 nm radiation are also provided. By comparison of the emission traces to the cathode fall traces, it can be seen that the onset of emission of 420 nm radiation indicates that the cathode fall has exceeded the metastable energy of 11.55 volts and that stepwise excitation is proceeding.

A later onset of emission of 811.5 nm radiation indicates that the cathode fall has exceeded the energy of the 4p state, i.e., 13.08 volts, thereby permitting direct excitation to take place. An abrupt change of slope of the 420 nm excitation curve at about 14.5 volts indicates that the cathode fall has exceeded the excitation energy of the 5p state and that direct excitation of this level is occurring. Thus it is shown that, under known operating conditions, the presence of radiation of certain wavelengths provides a signature as to the cathode fall potential.

Figure 6A:
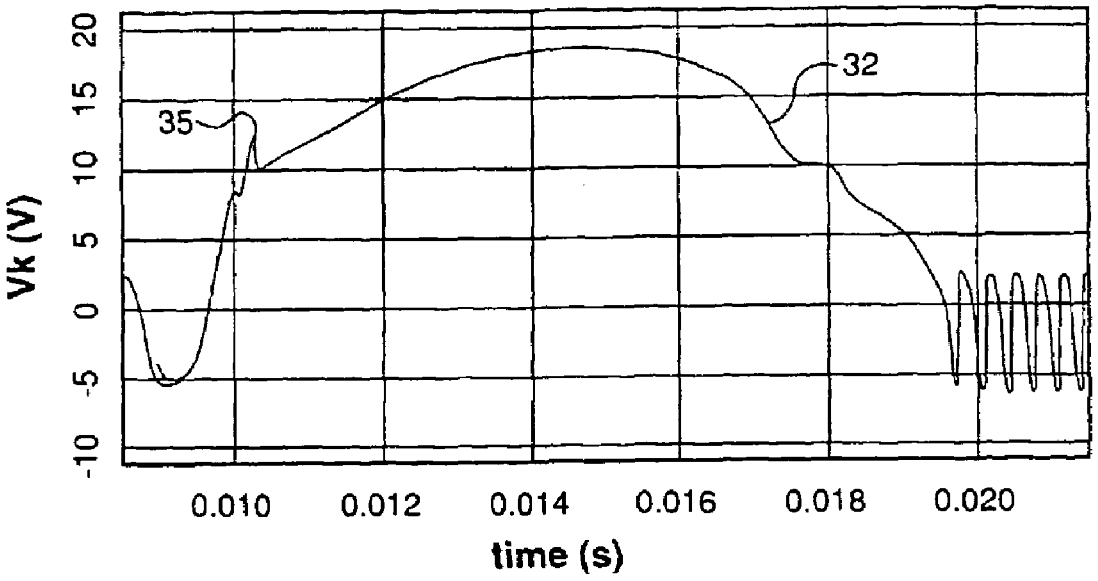
FIGS. 6A and 6B provide plots of cathode fall and onset of emission.
Figure 6B:
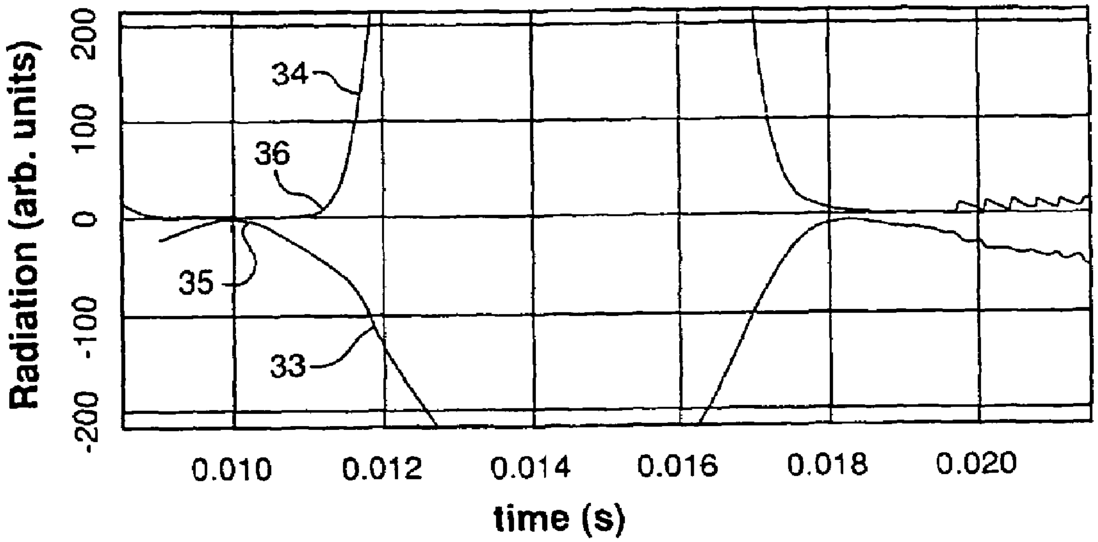

FIGS. 6A and 6B provide plots of measurement results for a T12 lamp operating at 360 ma and 60 Hz, with a 3.8 volt DC cathode heater voltage, and a condensed mercury temperature of 39.8 C. Shown is a trace 32 of cathode fall as a function of phase angle. Also shown are a trace 33 of emission of 420 nm radiation (shown inverted for clarity), and a trace 34 of emission of 811.5 nm radiation. All are shown as a function of time during the 60 Hz cathode half cycle. The onset 35 of 420 nm radiation corresponds to the cathode fall "spike", which exists at a cathode fall potential of about 11.55 volts. The onset 36 of 811.5 nm radiation corresponds to a cathode fall potential of about 13 volts. The onset 35 of 420 nm emission occurs about 0.9 milliseconds before the onset 36 of 811.5 nm emission.

Figure 7:
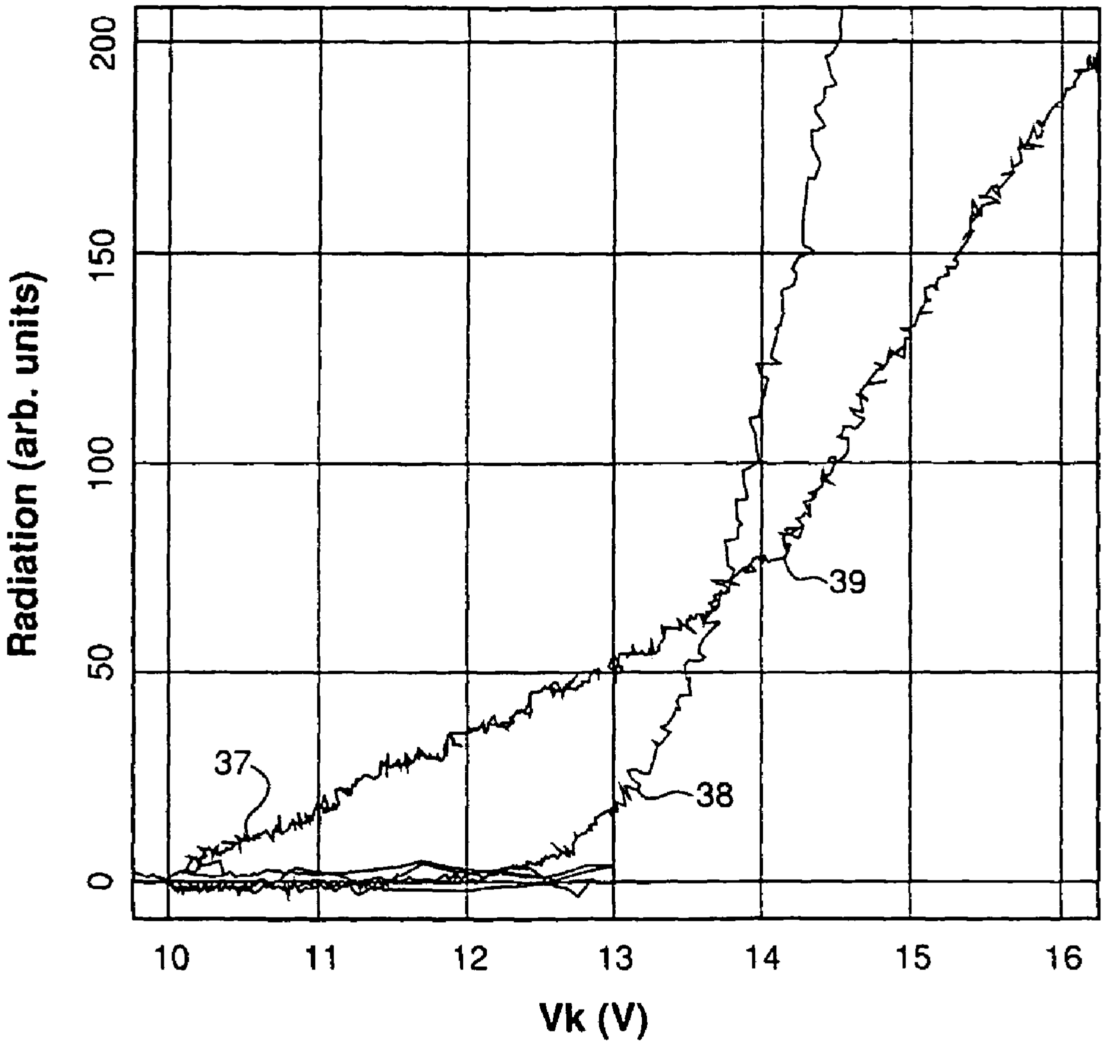
FIG. 7 provides plots of typical radiation intensities as a function of cathode fall.

FIG. 7 provides data on the 420 nm and 811.5 nm emissions shown in FIGS. 6A and 6B, plotted as a function of instantaneous cathode fall. Trace 37 shows an apparent onset of 420 nm emission at about 10 volts. Trace 38 for 811.5 nm shows a different threshold, i.e., at approximately 13 volts. The change 39 in the slope of the 420 nm trace 37, at about 14 volts, is in reasonable agreement with the expected onset of direct excitation of the 5p upper level at 14.5 volts.

It should be understood that the apparent onset of 420 nm radiation at 10 volts in FIG. 7 is an artifact, caused by the "spike" in cathode fall above 11.55 volts just at the "shoulder" of cathode fall in FIG. 6A. Because cathode fall has exceeded the metastable energy, there has been a supply of metastables created. These do not dissipate immediately, but persist for some small amount of time, providing excited atoms that may be further excited to emit 420 nm radiation even though the cathode fall has dropped below the metastable energy briefly following the spike. FIG. 7 clearly shows the direct excitation of 811.5 nm radiation and the onset of direct excitation (at 14.5v) of 420 nm radiation.

Figure 8A:
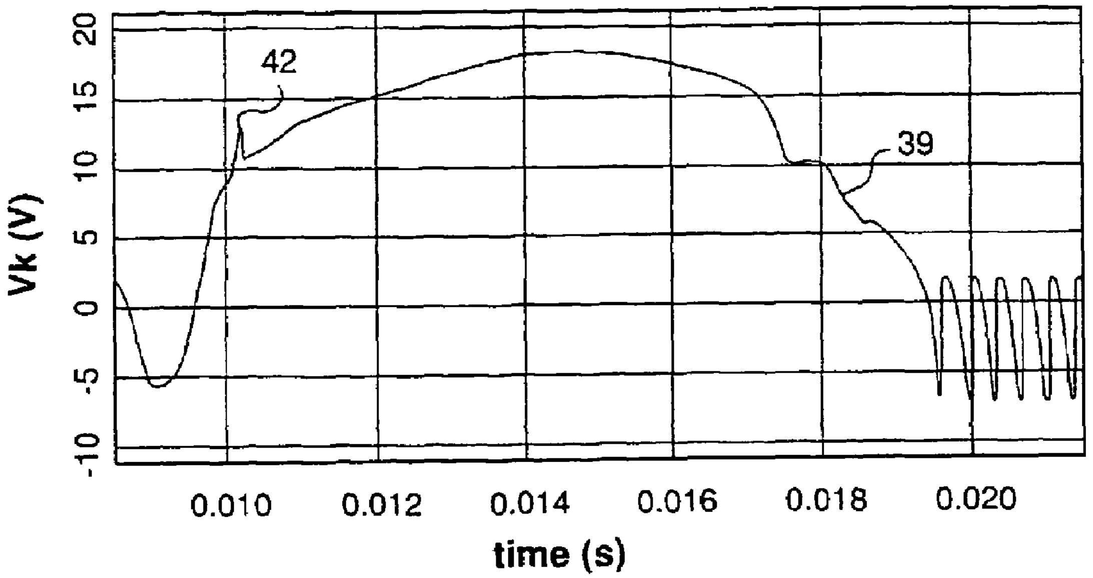
FIGS. 8A and 8B provide plots of cathode fall and onset of emission.
Figure 8B:
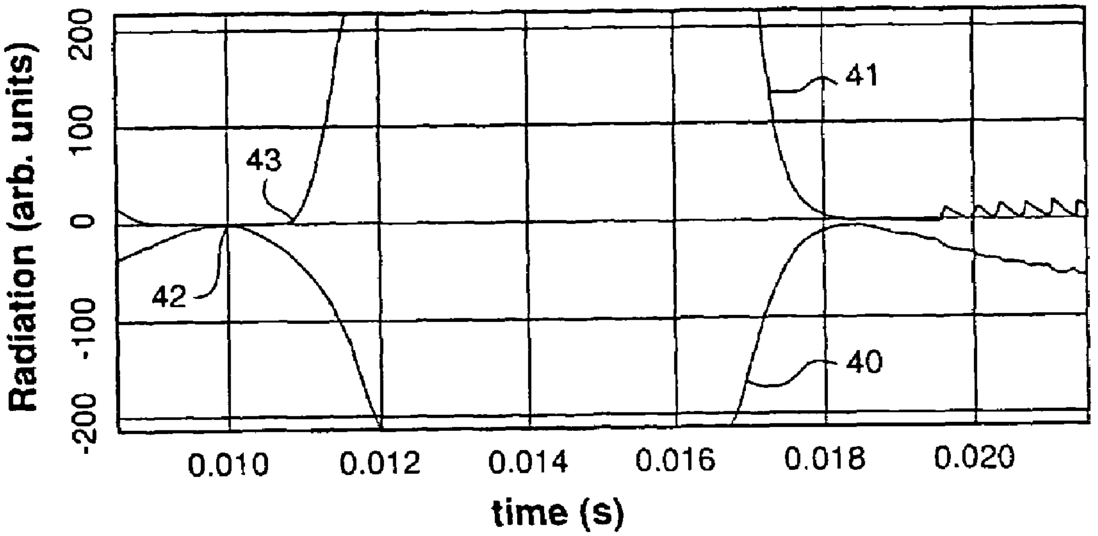

FIGS. 8A and 8B provide plots of measurement results for a T12 lamp operating at 250 ma and 60 Hz, with a 2.9 volt DC cathode heater voltage, and a condensed mercury temperature of 24.1 C. Shown is a trace 39 of cathode fall as a function of phase angle. Also shown are a trace 40 of emission of 420 nm radiation (shown inverted for clarity), and a trace 41 of emission of 811.5 nm radiation. All are shown as a function of time during the 60 Hz cathode half cycle. The onset 42 of 420 nm radiation corresponds to the cathode fall potential of about 11.55 volts. The onset 43 of 811.5 nm radiation corresponds to a cathode fall potential of about 13 volts. The onset 42 of 420 nm emission occurs about 0.75 milliseconds before the onset 43 of 811.5 nm emission.

Figure 9:
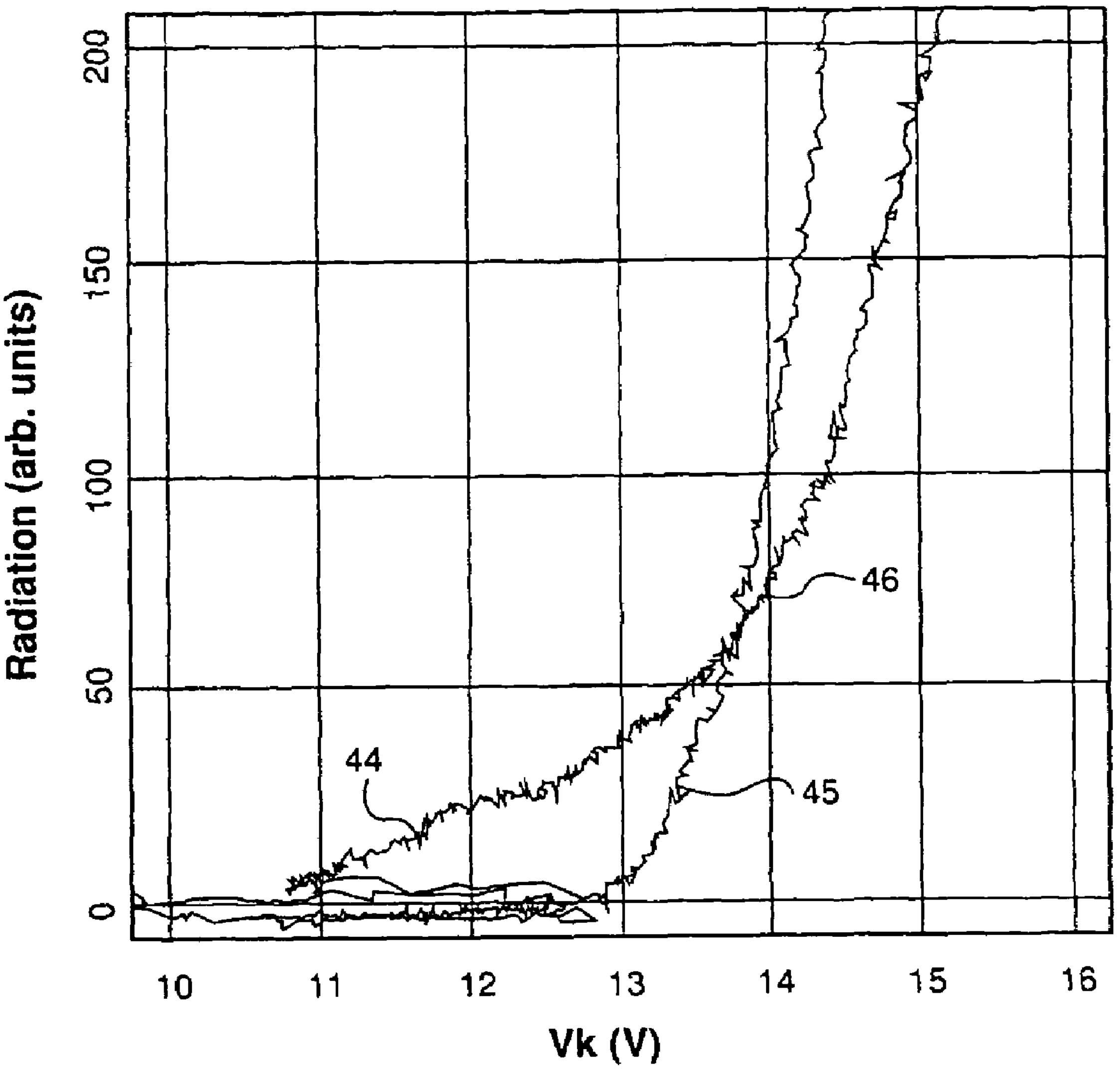
FIG. 9 provides plots of typical radiation intensities as a function of cathode fall.

FIG. 9 provides data on the 420 nm and 811.5 nm emissions shown in FIGS. 8A and 8B, plotted as a function of instantaneous cathode fall. Trace 44 shows an apparent onset of 420 nm emission at about 10.5 volts. Trace 45 for 811.5 nm shows a different threshold, i.e., at approximately 13 volts. A change 46 in the slope of the 420 nm trace 44, at about 14.1 volts, is in reasonable agreement with the expected onset of direct excitation of the 5p upper level at 14.5 volts. Again, it should be understood that the apparent onset of 420 nm radiation at 10 volts in FIG. 9 is an artifact caused by the "spike" in cathode fall above 11.55 volts just at the "shoulder" of cathode fall in FIG. 8.

Figure 10A:
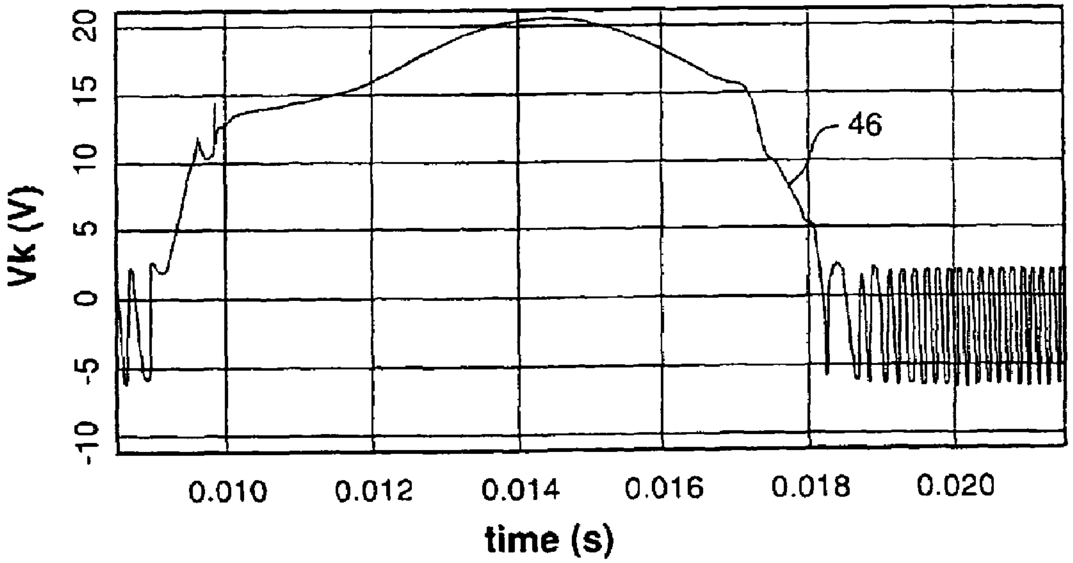
FIGS. 10A-16B provide plots of cathode fall and onset of emission under various conditions.
Figure 10B:
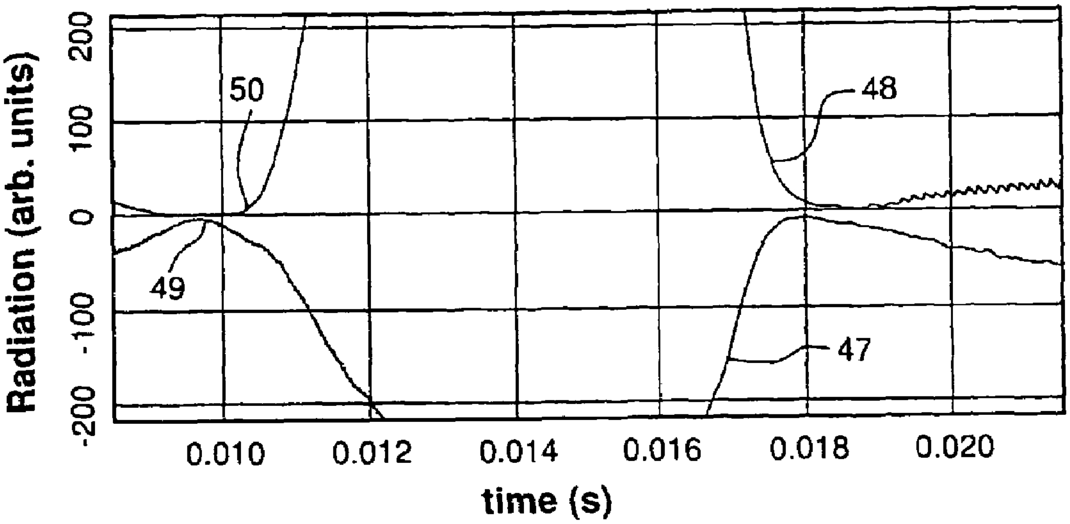

FIGS. 10A and 10B provide plots of measurement results for a T8 lamp operating at 270 ma and 60 Hz, with a 3.7 v cathode heater voltage, and a condensed mercury temperature of 40.4 C. Shown is a trace 46 of cathode fall as a function of phase angle. Also shown are a trace 47 of emission of 420 nm radiation (shown inverted for clarity), and a trace 48 of emission of 811.5 nm radiation, both as a function of time during the 60 Hz cathode half cycle. It can be seen that the time 49 of onset of 420 nm emission occurs about 0.6 milliseconds before the time 50 of onset of 811.5 emission.

FIGS. 11A-14B illustrate the applicability of the inventive method to determining cathode heater voltage or current profiles at reduced discharge current.

Figure 11A:
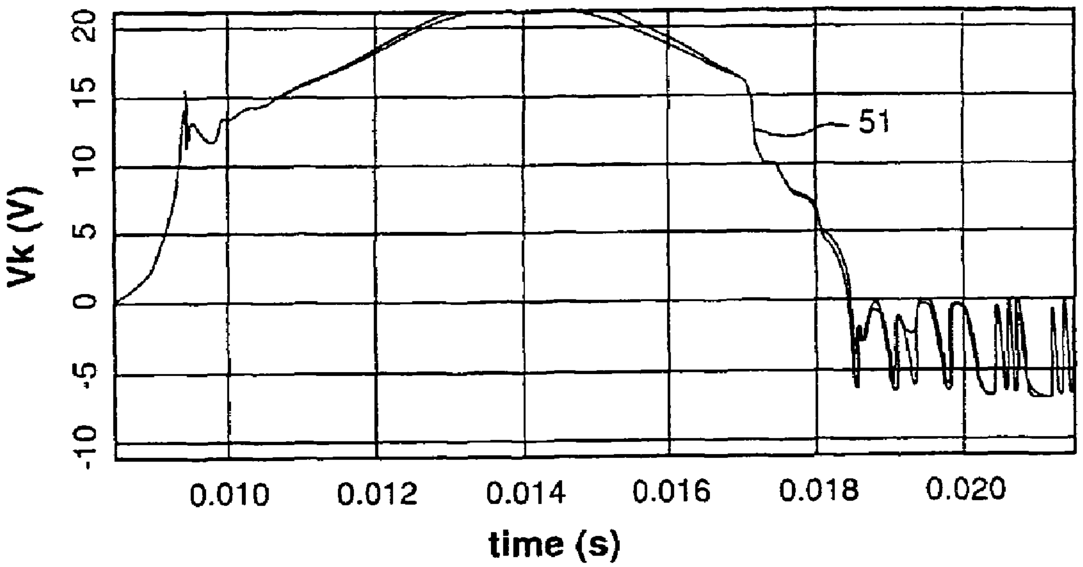
Figure 11B:
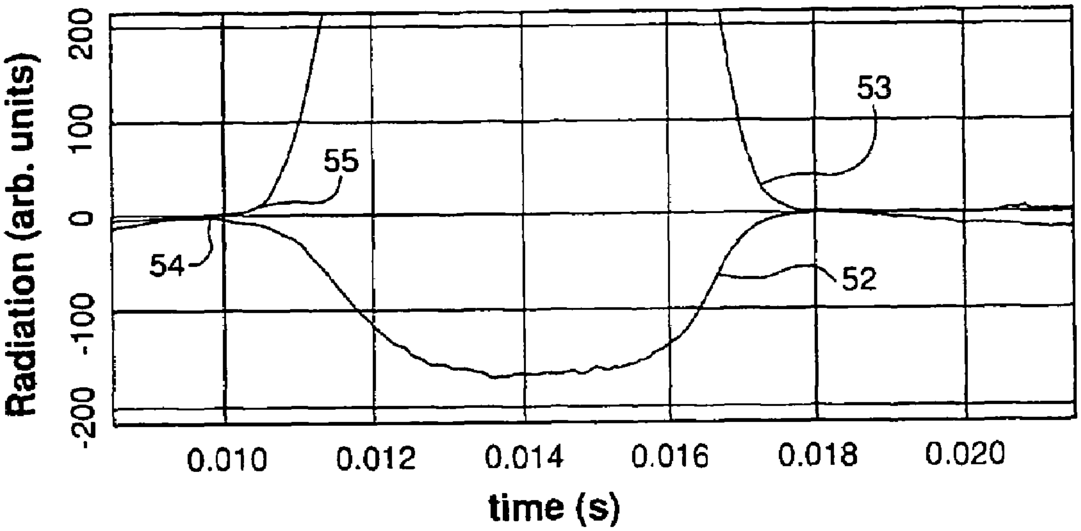

FIG. 11A and 11B provide plots of measurement results for a T8 lamp operating at 70 ma and 60 Hz, with a 2.9v cathode heater voltage, and a condensed mercury temperature of 40.4 C. Shown is a trace 51 of cathode fall as a function of phase angle. Also shown are a trace 52 of emission of 420 nm radiation (shown inverted for clarity), and a trace 53 of emission of 811.5 nm radiation. All are shown as a function of time during the 60 Hz cathode half cycle. It can be seen that the time 54 of onset of 420 nm emission occurs about 0.4 milliseconds before the time 55 of onset of 811.5 emission. Again, it should be understood that the apparent onset of 420 nm radiation at 10 volts in FIG. 11 is an artifact caused by a "spike" in cathode fall above 11.55 volts.

Figure 12A:
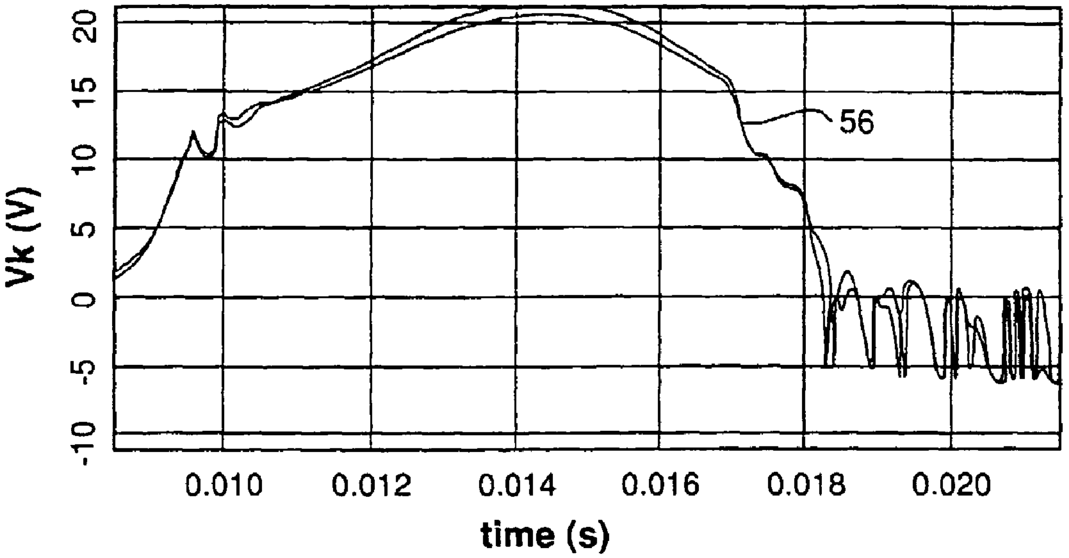
Figure 12B:
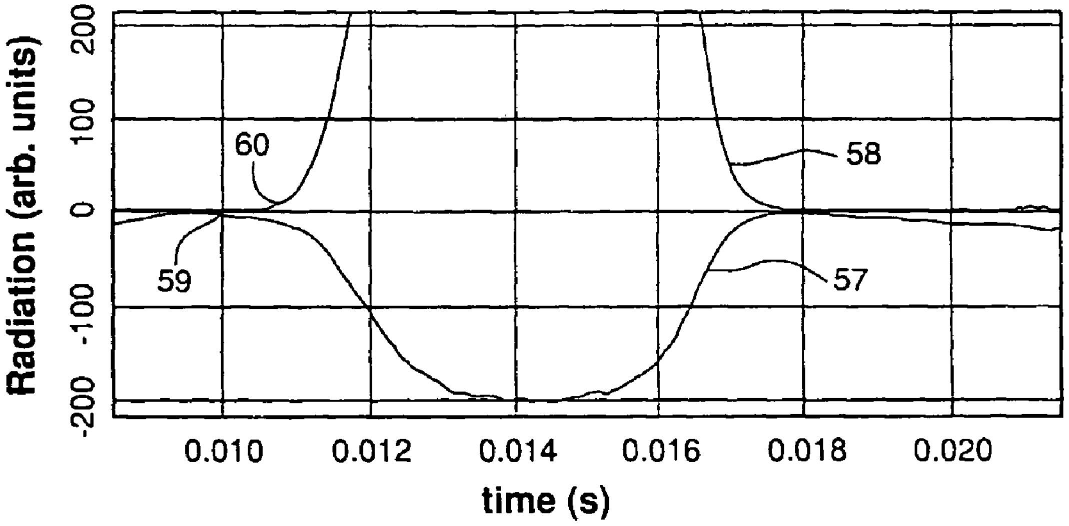

FIGS. 12A and 12B provide plots of measurement results for a T8 lamp operating at 70 ma and 60 Hz, with a 3.8 v cathode heater voltage, and a condensed mercury temperature of 40.4 C. Shown is a trace 56 of cathode fall as a function of phase angle. Also shown are a trace 57 of emission of 420 nm radiation (shown inverted for clarity), and a trace 58 of 811.5 nm emission. All are shown as a function of time during the 60 Hz cathode half cycle. It can be seen that the time 59 of onset of 420 nm emission occurs about 1.2 milliseconds before the time 60 of onset of 811.5 emission.

Figure 13A:
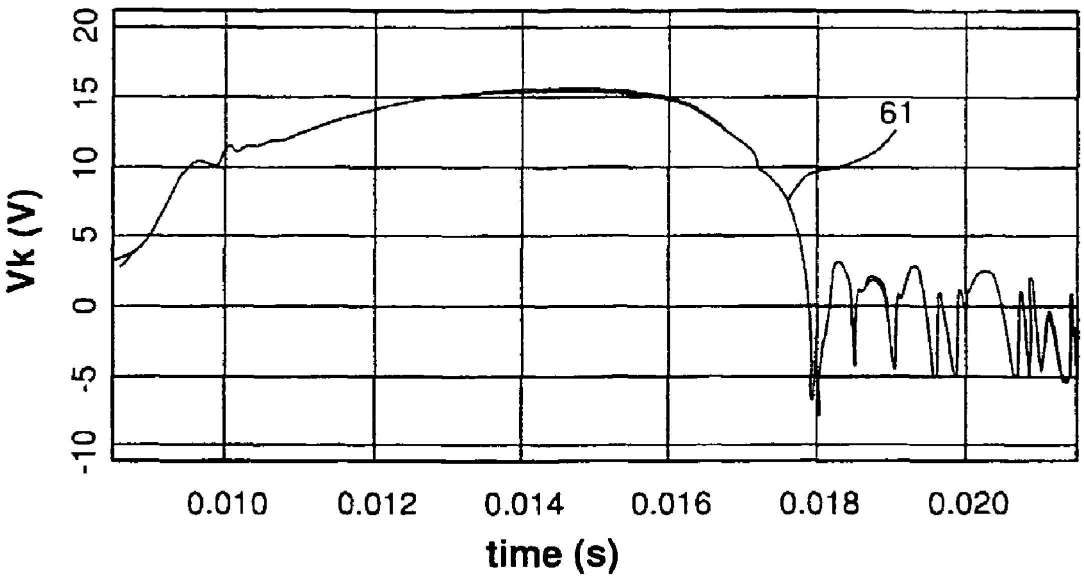
Figure 13B:
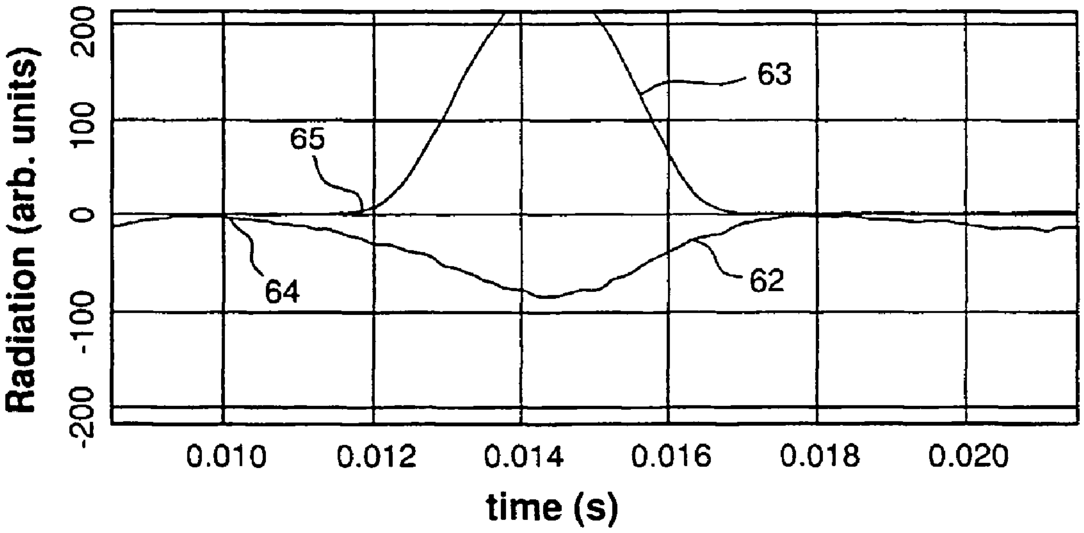

FIG. 13A and 13B provide plots of measurement results for a T8 lamp operating at 69 ma and 60 Hz, with a 4.6 v cathode heater voltage, and a condensed mercury temperature of 39.8 C. Shown is a trace 61 of cathode fall as a function of phase angle. Also shown are a trace 62 of emission of 420 nm emission (shown inverted for clarity), and a trace 63 of 811.5 nm emission. All are shown as a function of time during the 60 Hz cathode half cycle. It can be seen that the time 64 of onset of 420 nm emission occurs about 2.0 milliseconds before the time 65 of onset of 811.5 emission.

Figure 14A:
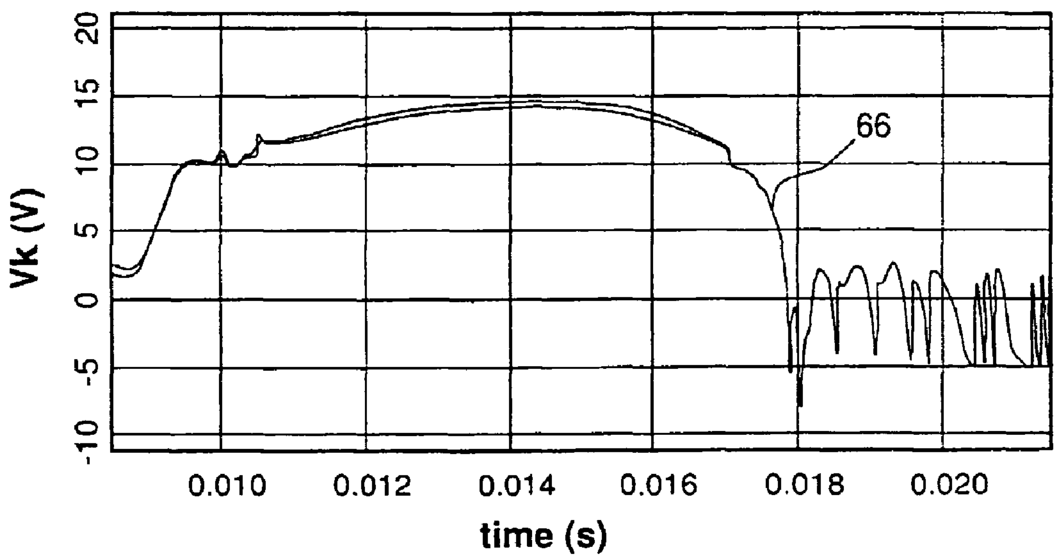
Figure 14B:
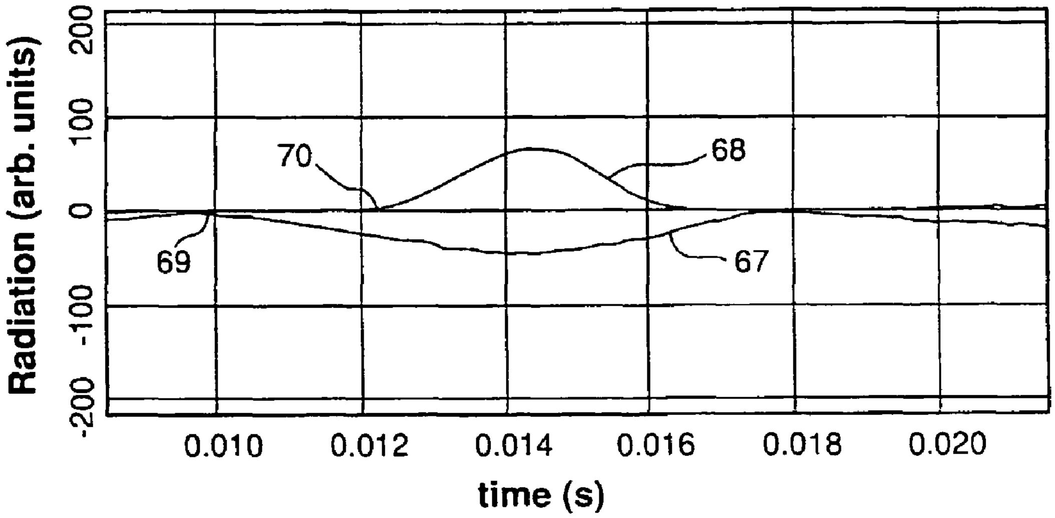

FIGS. 14A and 14B provide plots of measurement results for a T8 lamp operating at 65 ma and 60 Hz, with a 5.0 v cathode heater voltage, and a condensed mercury temperature of 39.5 C. Shown is a trace 66 of cathode fall as a function of phase angle. Also shown are a trace 67 of emission of 420 nm radiation (shown inverted for clarity), and a trace 68 of emission of 811.5 nm radiation. All are shown as a function of time during the 60 Hz cathode half cycle. It can be seen that the time 69 of onset of 420 nm emission occurs about 2.0 milliseconds before the time 70 of onset of 811.5 emission.

Figure 15A:
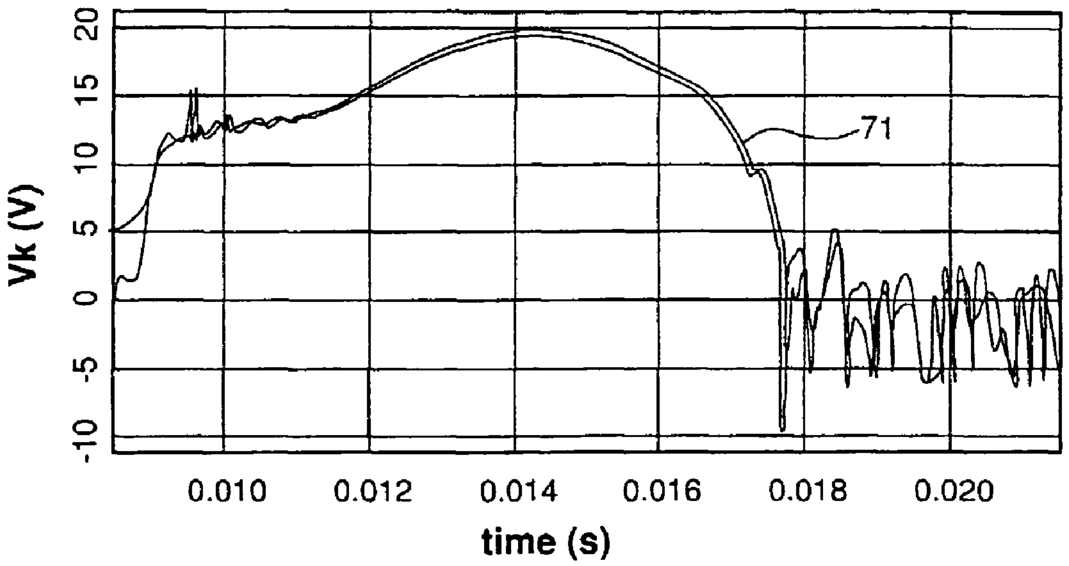
Figure 15B:
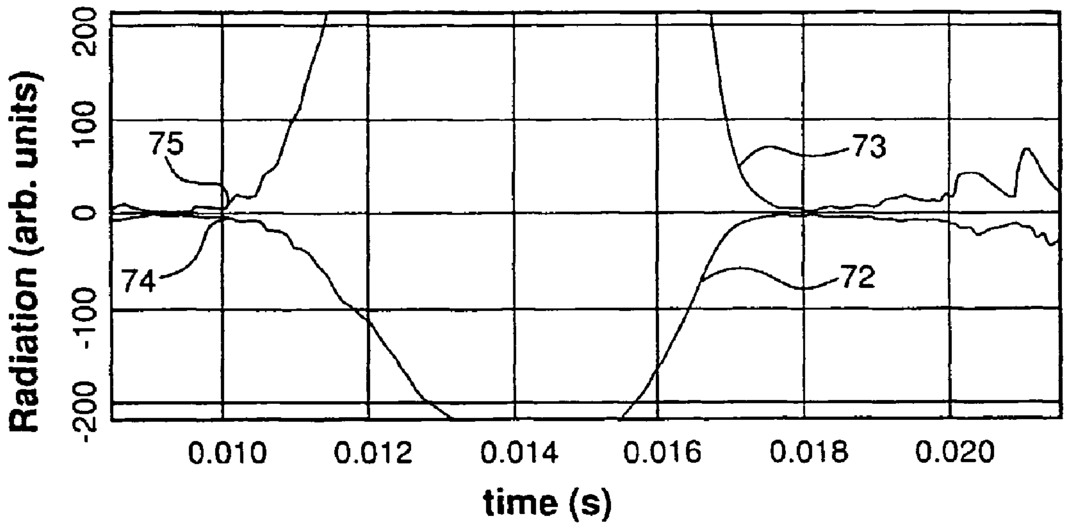

FIGS. 15A and 15B provide plots of measurement results for a T8 lamp operating at 65 ma and 60 Hz, with a 3.7 v cathode heater voltage, and a condensed mercury temperature of 19.7 C. Shown is a trace 71 of cathode fall as a function of phase angle. Also shown is a trace 72 of emission of 420 nm radiation (shown inverted for clarity), and a trace 73 of 811.5 nm radiation. All are shown as a function of time during the 60 Hz cathode half cycle. It can be seen that the time 74 of onset of 420 nm emission is about the same as the time 75 of onset of 811.5 emission. In fact, the two traces 72 and 73 are nearly identical. This indicates that, at the low mercury vapor pressure of this example, the 4p upper state of the 811.5 transition is primarily excited by a two-stage process via the metastable state.

Figure 16A:
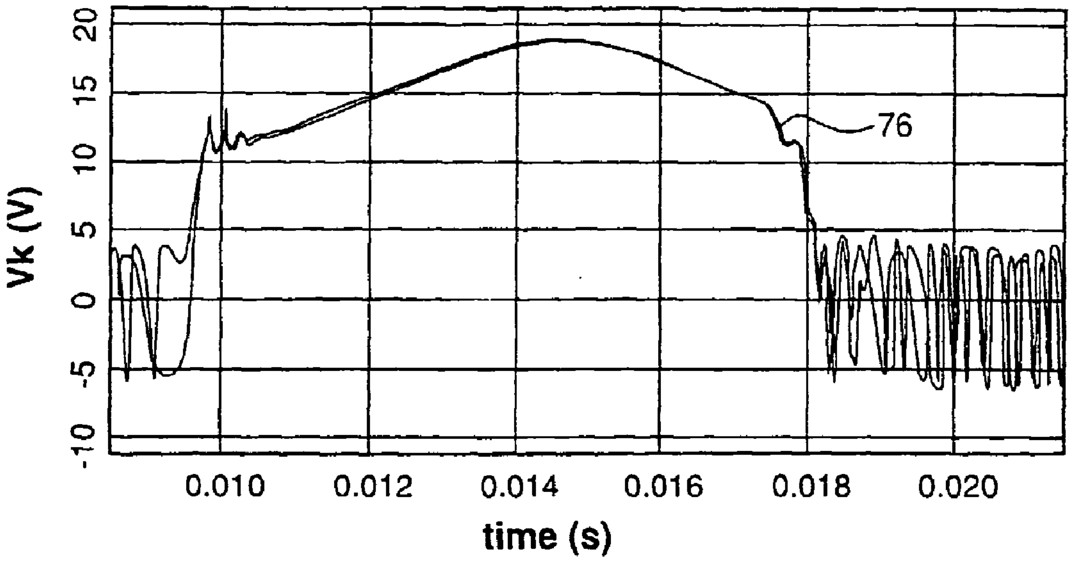
Figure 16B:
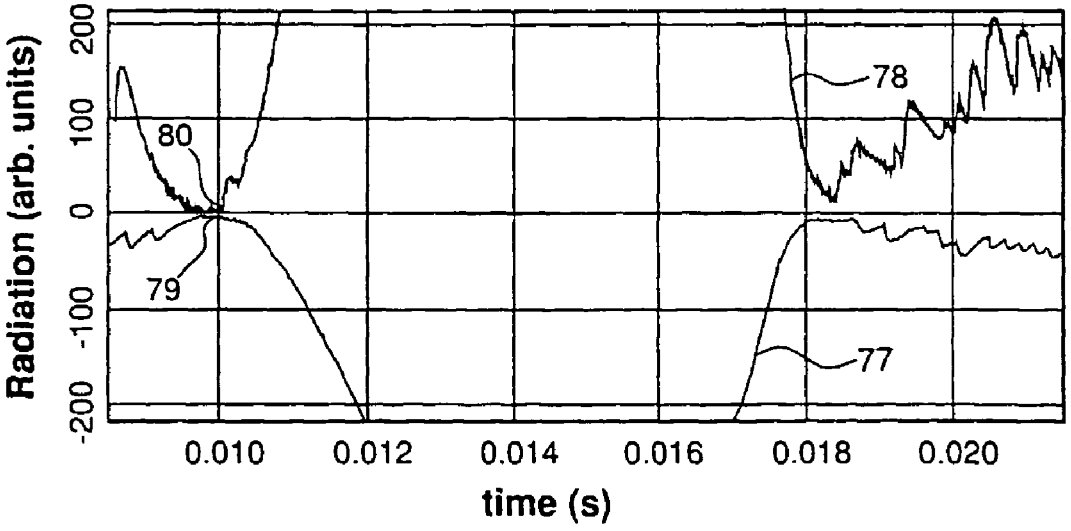

Similar results may be seen in FIGS. 16A and 16B, which provide plots of measurement results for a T8 lamp operating at 270 ma and 60 Hz, with a 3.7 v cathode heater voltage, and a condensed mercury temperature of 21.0 C. Shown is a trace 76 of cathode fall as a function of phase angle. Also shown is a trace 77 of emission of 420 nm radiation (shown inverted for clarity), and a trace 78 of emission of 811.5 nm radiation. All are shown as a function of time during the 60 Hz cathode half cycle. It can be seen that the time 79 of onset of 420 nm emission is about the same as the time 80 of onset of 811.5 emission. In fact, the two traces 77 and 78 are nearly identical. This indicates that, at the low mercury vapor pressure of this example, the 4p upper state of the 811.5 transition is primarily excited by a two-stage process via the metastable state.

It is known that mercury vapor density at a condensed mercury temperature of 21.0 C is one sixth the mercury vapor density at a condensed mercury temperature of 40 C. Consequently, the rate of destruction of metastable argon atoms by Penning collisions ionizing mercury is one sixth as rapid. Further, the rate of production of metastable atoms will remain unchanged, since that is a function only of lamp current and cathode fall. Because about half the loss of metastable atoms at high mercury pressure is due to Penning collisions and about half is due to electron collisions, the concentration of metastable atoms at the lower mercury vapor pressure will be triple that at the higher. Accordingly, two stage excitation predominates for both wavelengths under this condition. Direct excitation predominates for 811.5 nm at the higher mercury pressure and lower metastable concentration.

Table I presents data on peak cathode fall for the T8 lamps under various operating conditions determined by using the onset of 811.5 nm radiation to identify the point on the cathode fall trace corresponding to 13.1 volts. Condensed mercury temperatures are nominal. Data in parentheses are the result of extrapolation from measured values to peak current using the empirical extrapolation formula $V_{max}$=15.1+3.125*(2.0−t), in which t is the difference in time between the onsets of 420.0 nm and 811.5 nm radiations, and $V_{max}$ is the extrapolated maximum cathode fall. The voltage values shown not in parentheses in Table I were determined by capacitive measurements according to the methods disclosed and claimed in U.S. patent application Ser. No. 10/818,667.

FIGS. 17A-19C provide plots of measurement results for T8 lamps on a high-frequency ballast operating at a nominal 25 kHz and having a 212 ma discharge current. Condensed mercury temperature was not controlled in this experiment, but was the value in equilibrium with ambient at a discharge current of 212 ma, i.e., about 40 C.

Figure 17A:
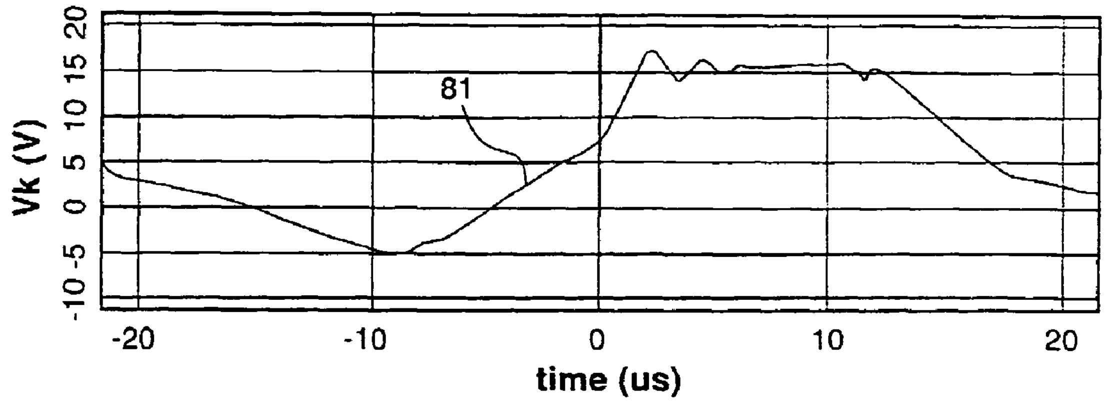
FIGS. 17A-C provide plots of relative cathode fall, lamp current, and radiation intensity for a typical fluorescent lamp.
Figure 17B:
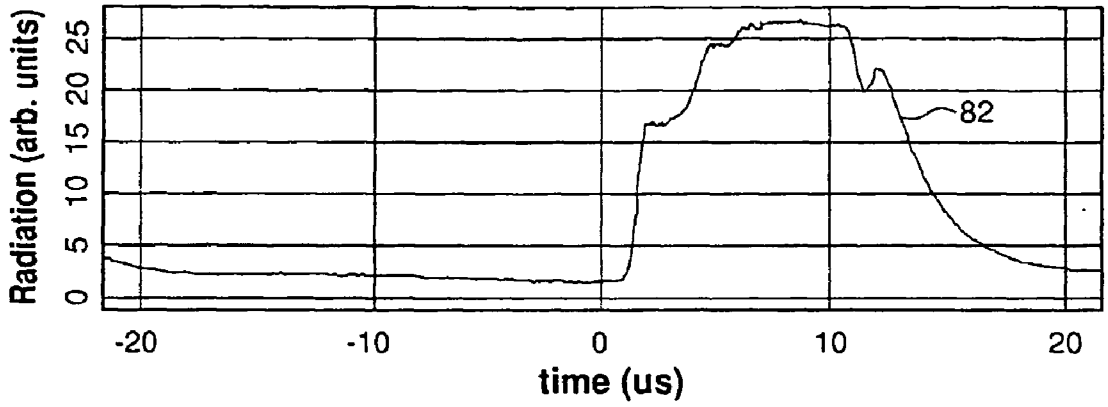
Figure 17C:
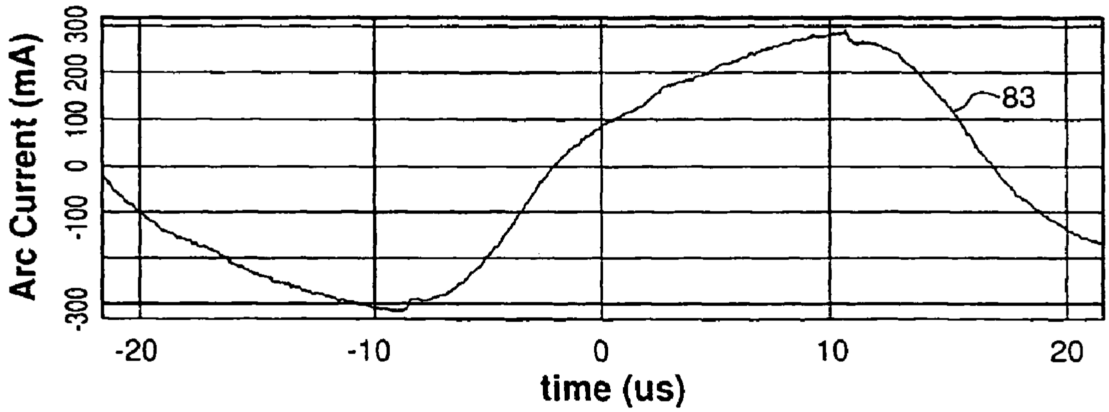

FIG. 17A-C provide a waveform 83 of discharge current, a waveform 81 of cathode fall, and a waveform 82 of emission of 811.5 nm radiation for a T8 lamp with 1.5v cathode heater voltage. Taking the phase angle of onset as marking the point at which cathode fall reaches 13.1v, the peak cathode fall for this case is 19.1 volts.

Figure 18A:
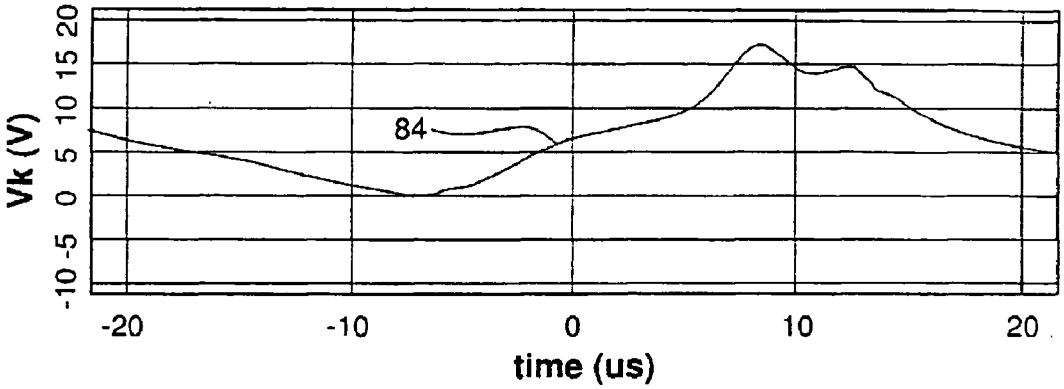
FIGS. 18A-19C provide plots of relative cathode fall and radiation intensity for a typical fluorescent lamp.
Figure 18B:
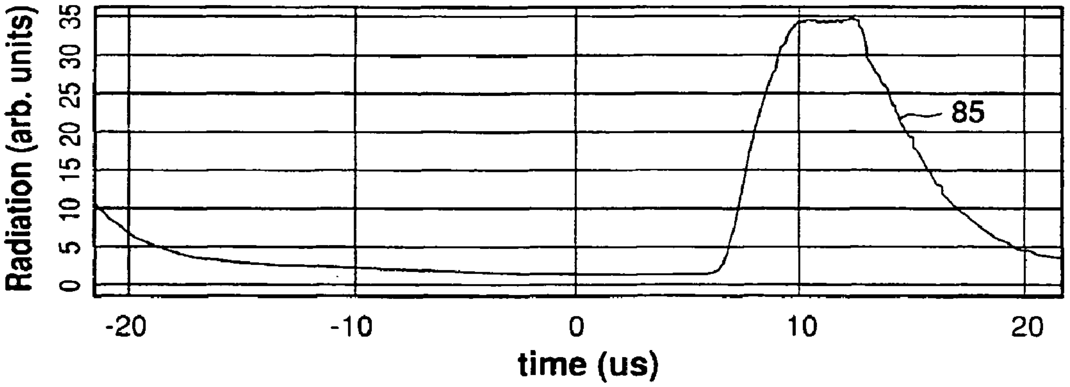
Figure 18C:
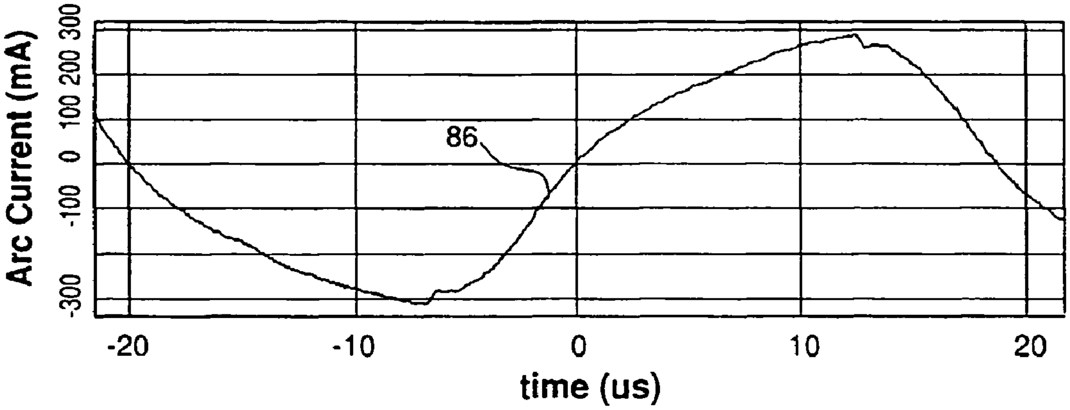

FIG. 18A-C provide a waveform 86 of discharge current, a waveform 84 of cathode fall, and a waveform 85 of emission of 811.5 nm radiation for a T8 lamp with 5.0v cathode heater voltage. Taking the phase angle of onset as marking the point at which cathode fall reaches 13.1v, the peak cathode fall for this case is 17.2 volts.

Figure 19A:
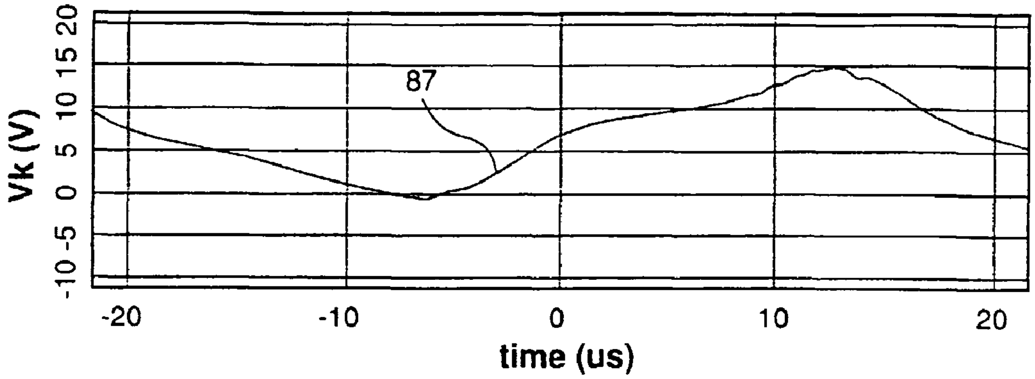
Figure 19B:
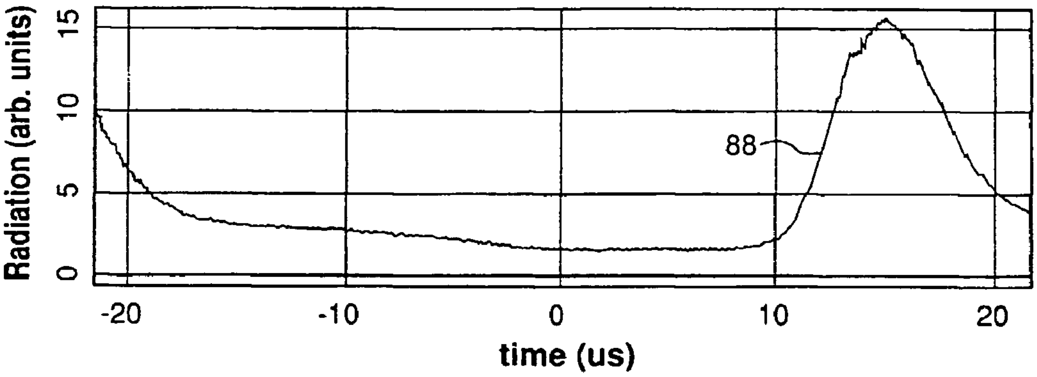
Figure 19C:
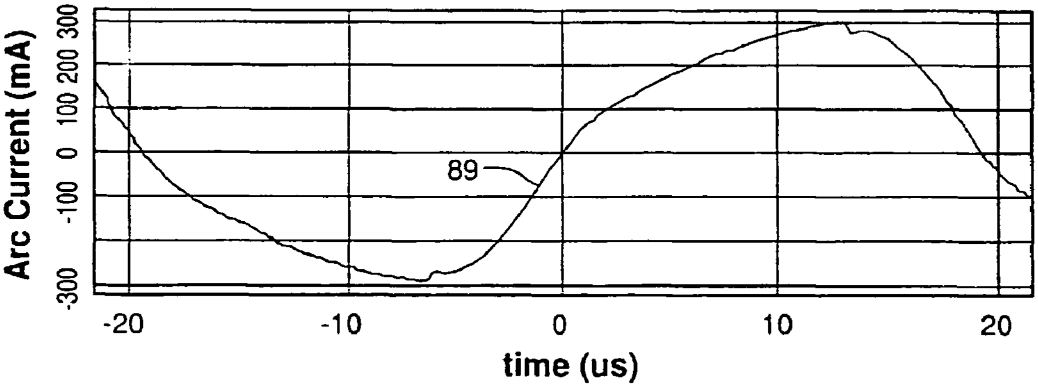

FIG. 19A-C provide a waveform 89 of discharge current, a waveform 87 of cathode fall, and a waveform 88 of emission of 811.5 nm radiation for a T8 lamp with 6.0v cathode heater voltage. Taking the phase angle of onset as marking the point at which cathode fall reaches 13.1v, the peak cathode fall for this case is 15.4 volts.

Figure 20:
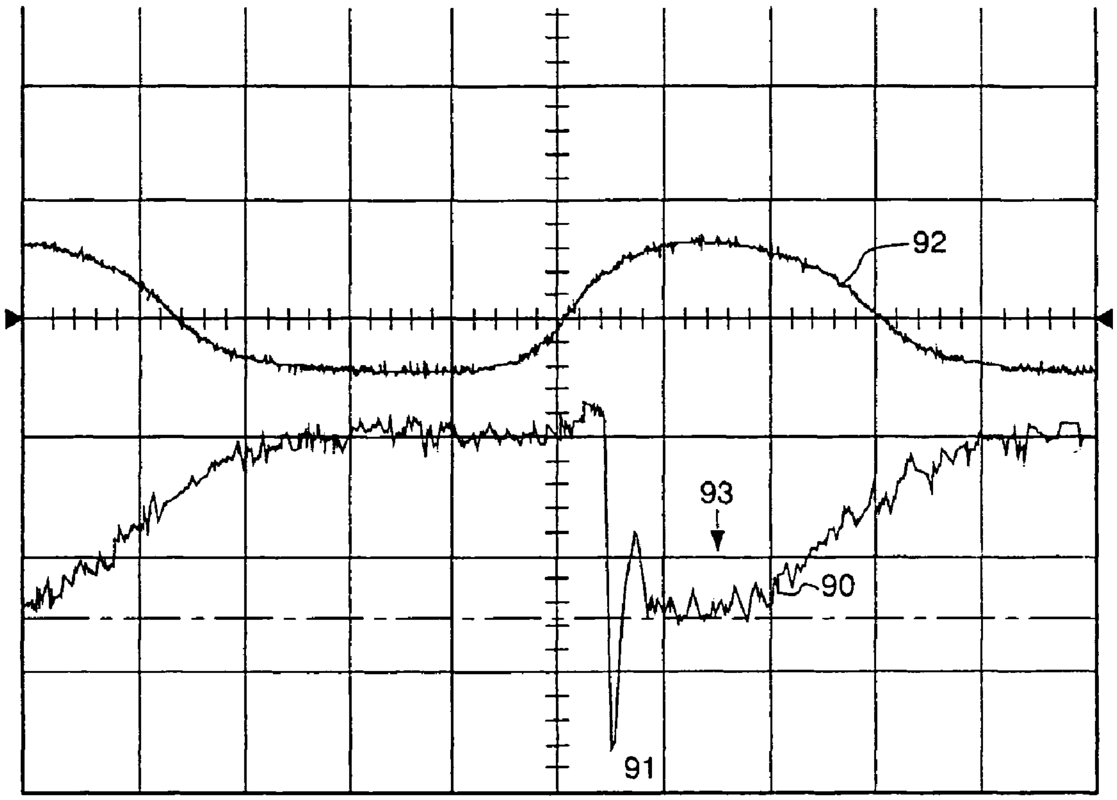
FIG. 20 provides plots of relative lamp current and radiation intensity for a typical fluorescent lamp.
Figure 21:
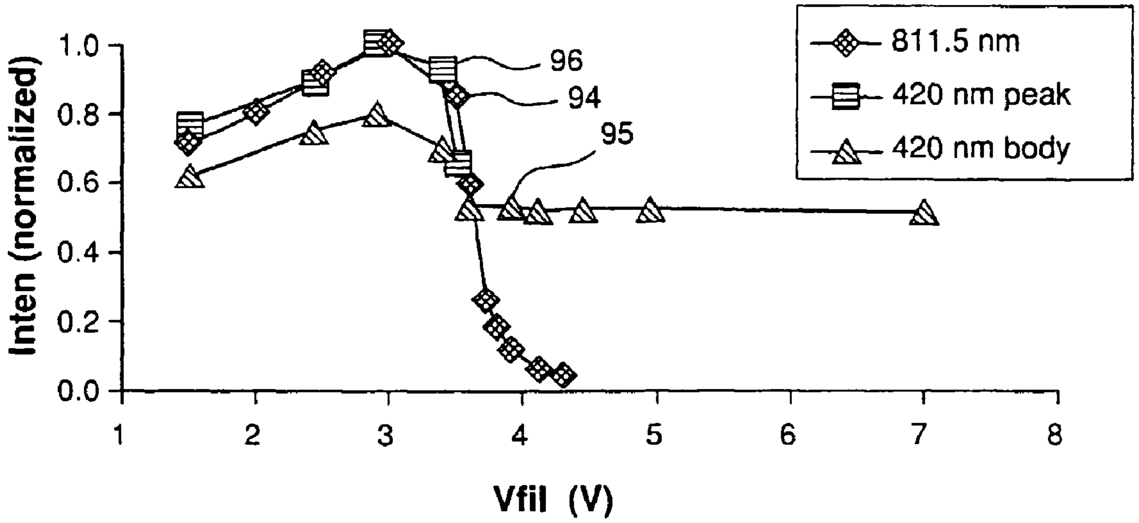
FIG. 21 provides plots of radiation intensity versus cathode heater voltage for a typical fluorescent lamp.

FIGS. 20 and 21 illustrate another method for spectroscopically measuring cathode fall to determine a heater voltage or current profile. Such a technique may be particularly suitable where capacitive measurements are difficult or impossible to obtain. Such might be the case for folded fluorescent lamps, in which the electrode opposite the test electrode is disposed adjacent to the test electrode. In this case, the intensities of the several spectral lines may be used to deduce information about peak cathode fall.

FIG. 20 provides traces of lamp current and the intensity of 420 nm radiation from a 26 watt, T4 compact fluorescent lamp, folded into four legs, operated on its electronic ballast at a current of 80 ma at a nominal 25 kHz and a 1.5 v cathode heater voltage. Shown is a lamp-current waveform 92, and a plot 93 of the emission of 420 nm radiation. The emission plot 93 has a "peak" 91 and a "shoulder" 90. It was found that the waveform (not shown) of emission of 811.5 nm radiation had only a "peak" and no "shoulder."

FIG. 21 provides the results of an experiment conducted to measure peak and shoulder intensities of spectral lines as a function of cathode heater voltage. As shown, the maximum intensity 94 of 811.5 nm radiation, the maximum intensity 95 of the "shoulder" component of 420 nm radiation, and the maximum intensity 96 of the "peak" component of 420 nm initially increase with increasing cathode heater voltage. Each goes through a maximum, and then drops abruptly at a cathode heater voltage of about 3.4-3.5 volts. The intensity of the 811.5 nm radiation continues to decrease to very low values with increasing filament voltage. The peak of 420 nm radiation decreases until it is no longer detectable above the shoulder. The shoulder initially decreases, but then levels off and decreases no further, even for cathode heater voltage as high as 7 volts.

These results may be interpreted as showing that 811.5 nm radiation is excited almost entirely by direct excitation. It is excited during the cathode fall peak, which exceeds 14.5 volts at low cathode heater voltage. The peak of the 420 nm emission is also excited by direct excitation. As cathode heater voltage increases, cathode fall in the peak drops below first 14.5 volts and, at a somewhat higher cathode heater voltage, cathode fall in the peak drops below 13.1 volts. Hence, both the 420 nm peak emission and the 811.5 peak emission drop to zero. The 3.6 volt cathode heater voltage at which 811.5 nm emission drops to 50% of its maximum value may be interpreted as the value for which the peak falls below 13.1 volts. The "shoulder" of the 420 nm radiation shows that there is two stage excitation of 420 nm radiation. The fact that the maximum intensity of the shoulder never goes to zero signals that the cathode fall never goes below 11.5 volts, even for cathode heater voltage of 7 volts.

Thus, the use of the information provided by the onset and intensity of the emission of certain, pre-selected spectral lines enables a determination of minimum values of cathode heater voltage or current as a function of discharge current.

In order to calibrate spectral results, and to ensure that the onsets of emission-represented cathode fall exceed the corresponding excitation potential, cathode fall may also be measured by the capacitive technique described in U.S. patent application Ser. No. 10/818,667. For example, the peak cathode falls shown in Table I are, in general, slightly lower than, but within two volts of, the values determined by the capacitive technique. To determine the correct cathode heater voltage or current profile for a dimming ballast, using these two techniques in combination may be desirable. As demonstrated herein, however, it is not necessary to use the two techniques in combination because satisfactory optimization of cathode heater voltage or current may be derived from the measured spectroscopic results.

The principles of the invention may be applied in the design of dimming ballasts. In designing a dimming ballast, it is desirable to determine an optimum value for current, $I_{fil}$, supplied to the filament electrode (by application of a voltage, $V_{fil}$, across the electrode). If $V_{fil}$ is too low, then the cathode fall increases to increase electron emissions, which causes ion bombardment that damages the filament's emissive coating. If $V_{fil}$ is too high, then the emissive coating evaporates. It is desirable to identify an optimal value of $V_{fil}$ for each value of discharge current $I_d$.

Figure 22:
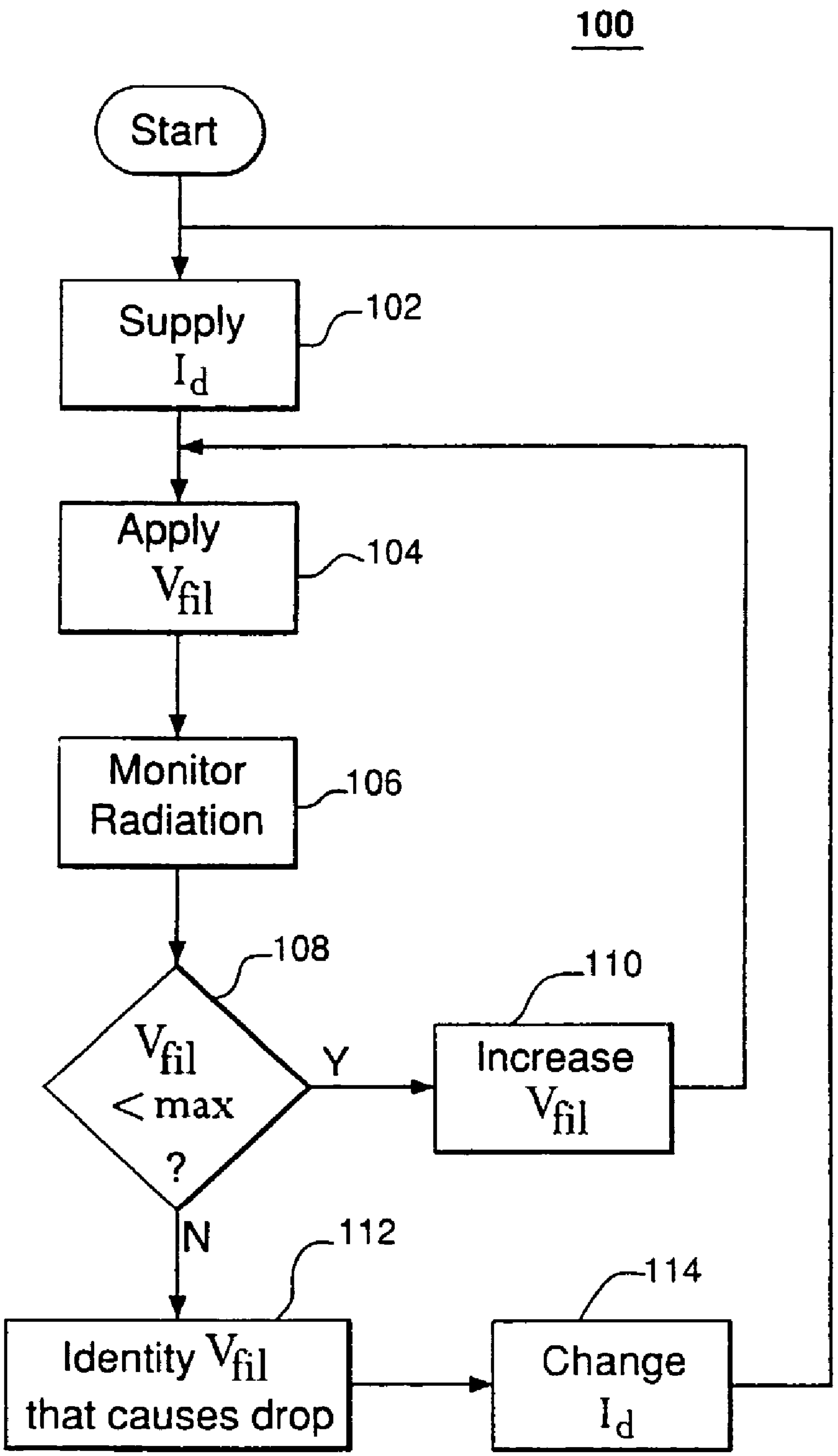
FIG. 22 is a flowchart of a method for determining a trajectory of electrode-heater voltage as a function of discharge current.

A method 100 for determining a trajectory of electrode voltage $V_{fil}$ as a function of discharge current $I_d$ is described in connection with FIG. 22. At step 102, an initial amount of discharge current is supplied to the electrode. At step 104, a first amount of electrode voltage is applied to the electrode. At step 106, 811.5 nm radiation from a region near the electrode (the "cathode region") is monitored. At step 108, it is determined whether the cathode heater voltage is less than a maximum cathode heater voltage. The maximum cathode heater voltage may be chosen to avoid damage to the electrode (e.g., approximately 6-7 v). At step 110, the cathode heater voltage is increased, and the process repeats until the maximum cathode heater voltage is reached. If, at step 108, it is determined that the maximum cathode heater voltage has been reached, then, at step 112, the value of cathode heater voltage that caused the 811.5 nm radiation to drop is identified. At step 114, the discharge current is changed, and the process 100 may be repeated for any number of discharge currents.

Figure 23A:
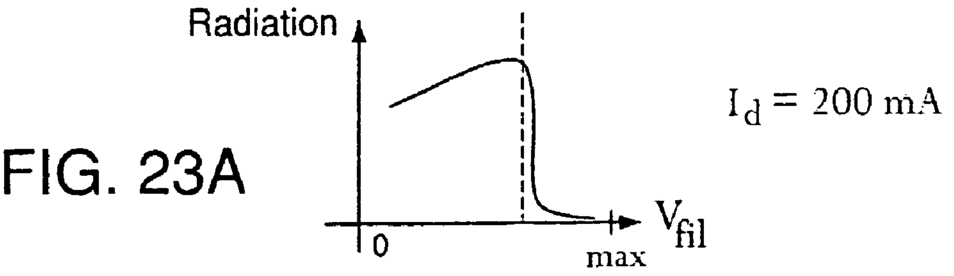
FIGS. 23A-D are representative plots of radiation intensity as a function of cathode heater voltage for a plurality of values of discharge current.
Figure 23B:
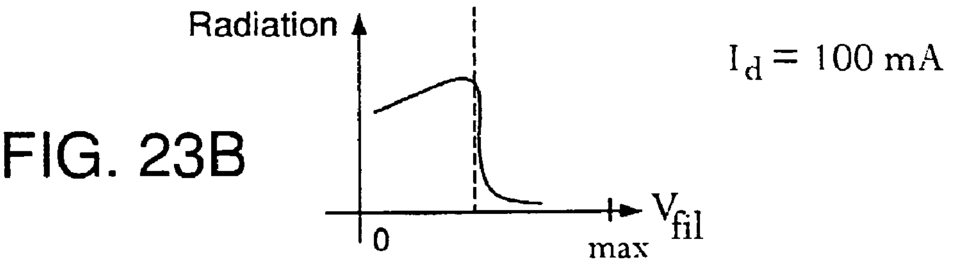
Figure 23C:
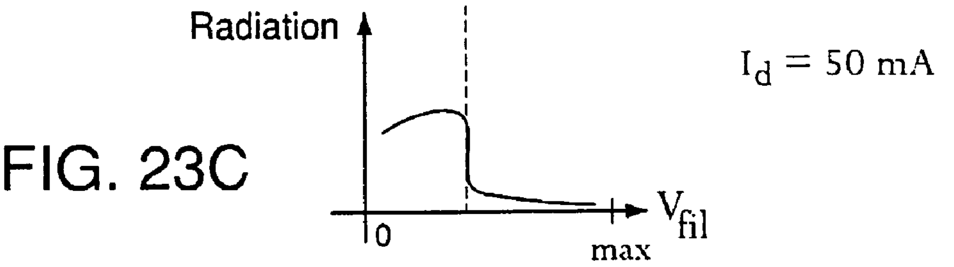
Figure 23D:
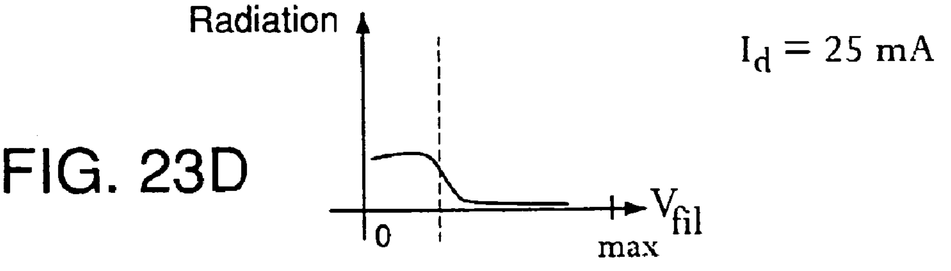
Figure 23E:
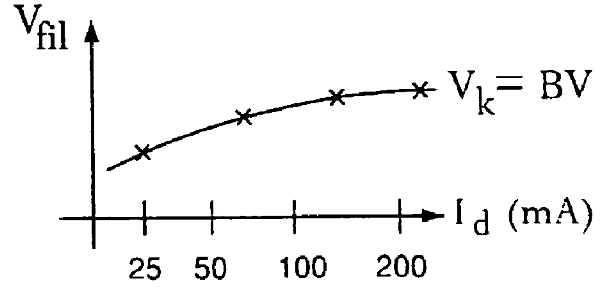
FIG. 23E provides a cathode heater voltage trajectory based on the data shown in FIGS. 23A-D.

FIGS. 23A-D are representative plots of intensity of 811.5 nm radiation as a function of cathode heater voltage for a plurality of values of discharge current. FIG. 23E provides a cathode heater voltage trajectory 118 that is based on the data shown in FIGS. 23A-D. The trajectory 118 shows cathode heater voltage as a function of discharge current.

Using the principles of the invention, a ballast designer, for example, may now identify a range of cathode-heater voltages that may be supplied to the electrodes of a certain lamp (or lamp type) so that cathode fall does not exceed a level that would cause the lamp to fail even over a range of discharge currents. For example, one could determine a range of cathode-heater voltages that would prevent the peak cathode fall from exceeding the excitation threshold of the rare-gas filling, e.g., ~13 v for argon. A respective range of cathode-heater voltages may then be determined for each of a number of lamp types. A dimming ballast may then be designed to cause the cathode-heater power supply to supply a cathode-heater voltage that would be within range for multiple lamp types.

Such a ballast could include a memory in which may be stored a profile of filament heater voltage as a function of discharge current and/or lamp type. A controller, such as a microprocessor, may be adapted to dynamically determine from the stored profile an amount of heater current to supply to the electrode. The controller may cause the cathode-heater power supply to provide the determined amount of heater current to the electrode based on discharge current being delivered to the lamp, for each of one or more lamp types.

It should be understood that this technique may be employed using any $V_{fil}$ waveform (e.g., sine, square, etc.). Further, it should be understood that this technique may be employed on a representative population of lamps or lamp types. Using the information gathered about cathode-heater voltage as a function of discharge current for each of several lamps or lamp types, a ballast may be designed that that causes the cathode-heater power supply to apply a cathode-heater voltage, as a function of discharge current, according to a trajectory that would work for each of the several lamps or lamp types. Thus, a single ballast type could be designed to work with a number of lamp types.

Using the principles of the invention, a ballast designer could optimize a ballast design for rapid-start applications as well as for steady-state operation (as described above). For rapid-start applications, a typical ballast designer seeks to determine whether a given preheat profile is acceptable. The issue is typically one of identifying a preheat profile that results in the quickest relaxation to their steady-state, or "running," values. The running values may be chosen using the above-described technique.

Figure 24A:
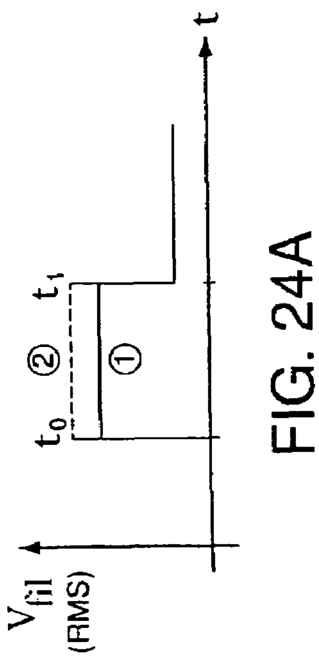
FIGS. 24A-D illustrate selection of a preheat profile suitable for a rapid-start ballast.
Figure 24B:
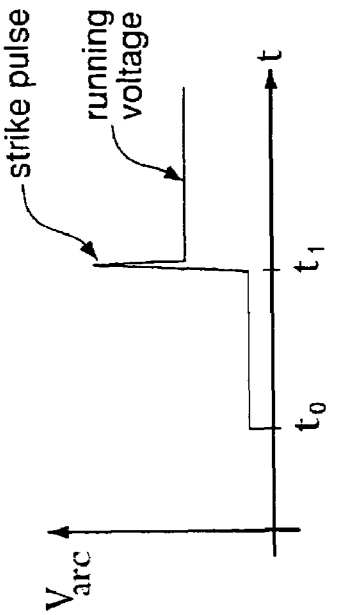
Figure 24C:
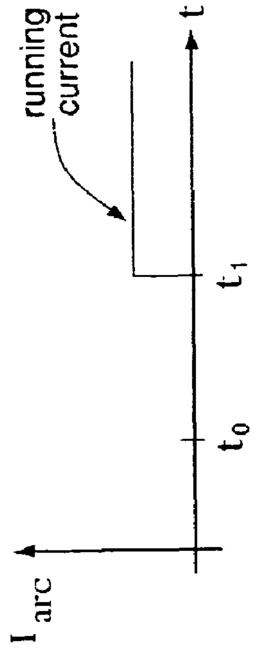

FIGS. 24A-D illustrate selection of a preheat profile suitable for a rapid-start ballast. In FIG. 24A, cathode heater voltage is shown as a function of t. At a first time, $t_0$, power is applied to the ballast or, in the case of an electronically controlled ballast, a "start" command is received. A rapid-start cathode heater voltage is applied until a time $t_1$, when the lamp strikes. Two such examples are shown in FIG. 24A. FIG. 24B depicts arc voltage as a function of time. As shown, arc voltage is zero until $t_0$, and relatively low from $t_0$ until $t_1$. At $t_1$ the lamp strikes and the arc voltage peaks. Thereafter, the arc voltage settles down to its running value. As shown in FIG. 24C, arc current is near zero until $t_1$, at which time it rises to its running value.

Figure 24D:
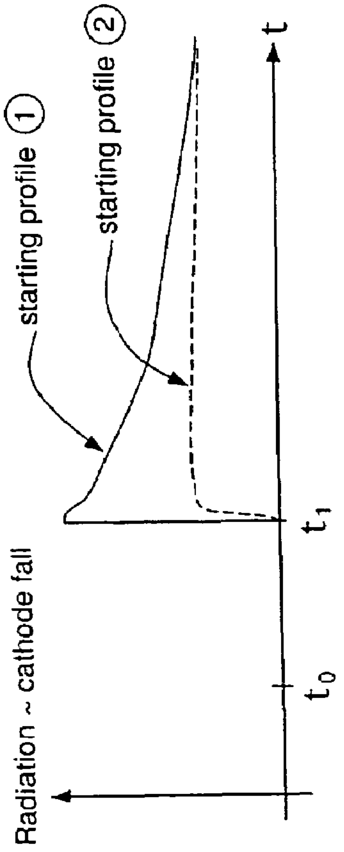

FIG. 24D provides plots of detected radiation as a function of time for the rapid-start cathode heater voltages depicted in FIG. 24A. As shown, the radiation peak for profile 1 is much higher than the radiation peak for profile 2. Thus, it may be determined that the starting profile 2 results in a quicker relaxation to steady-state than starting profile 1.

Figure 25:
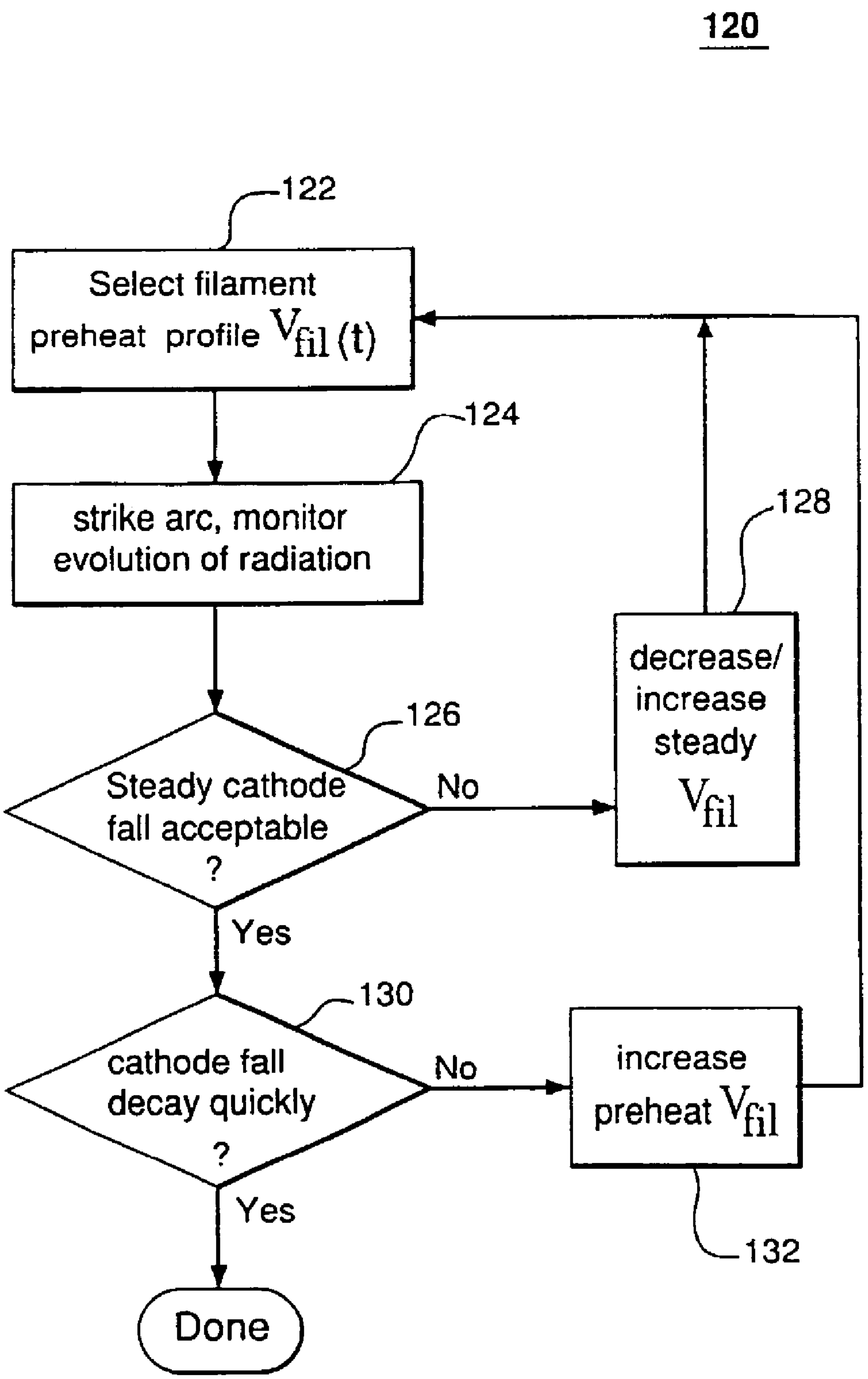
FIG. 25 is a flowchart of a method according to the invention for identifying a starting profile for the design of a rapid-start ballast.

FIG. 25 is a flowchart of a method 120 according to the invention for identifying a starting profile for the design of a rapid-start ballast. At step 122, a first preheat profile $V_{fil}(t)$ is selected. At step 124, the heating profile is applied over time until the arc strikes. Radiation intensity is monitored over time. If, at step 126, it is determined that the steady-state cathode fall is unacceptable, then at step 128, the steady-state cathode heater voltage is changed (increased or decreased), and the process is repeated until an acceptable steady-state cathode heater voltage is identified.

If, at step 126, it is determined that the steady-state cathode heater voltage is acceptable, then, at step 130, it is determined, from the measured radiation intensity, whether the rate at which cathode fall decays to steady-state is acceptable. If, at step 130, it is determined that the cathode fall decay rate is unacceptable, then, at step 132, the preheat voltage is increased, and the process repeats until an acceptable cathode fall decay rate is identified at step 132. Thus, a preheat profile for a rapid-start ballast may be identified (for a single lamp type or a plurality of lamp types) using apparatus and methods according to the invention.

Using the principles of the invention, a ballast designer could design a ballast that "remembers" a plurality of steady-state heating trajectories and/or rapid-start heating profiles. Such a ballast could include a microprocessor, for example, or other such controller that may be preprogrammed with respective steady-state trajectories and/or rapid-start heating profiles for each of a plurality of lamp types. The ballast could then be informed, during installation or the ballast or lamp, for example, of the lamp type that is coupled to the ballast. Accordingly, the ballast could cause the cathode-heater power supply to apply cathode-heater voltage, as a function of discharge current, according to a trajectory identified for the lamp type to which the ballast is actually coupled. Thus, a single, flexible ballast could be designed to work optimally with each of a number a lamp types, thereby maximizing lamp life for each lamp type.

Similarly, a ballast designer could design a ballast that causes the cathode-heater power supply to dynamically provide a heater current (or voltage) that prevents the cathode fall from exceeding a threshold level. Thus, a "smart" dimming ballast could be designed that dynamically controls cathode-heater current based on discharge current.

Such a smart dimming ballast could include a microprocessor, for example, or other such controller, that is electrically coupled to a radiation detection system, such as described above in connection with FIG. 5. A block diagram of a smart ballast for dynamically controlling cathode-heater current based on discharge current is provided in FIG. 26.

Figure 26:
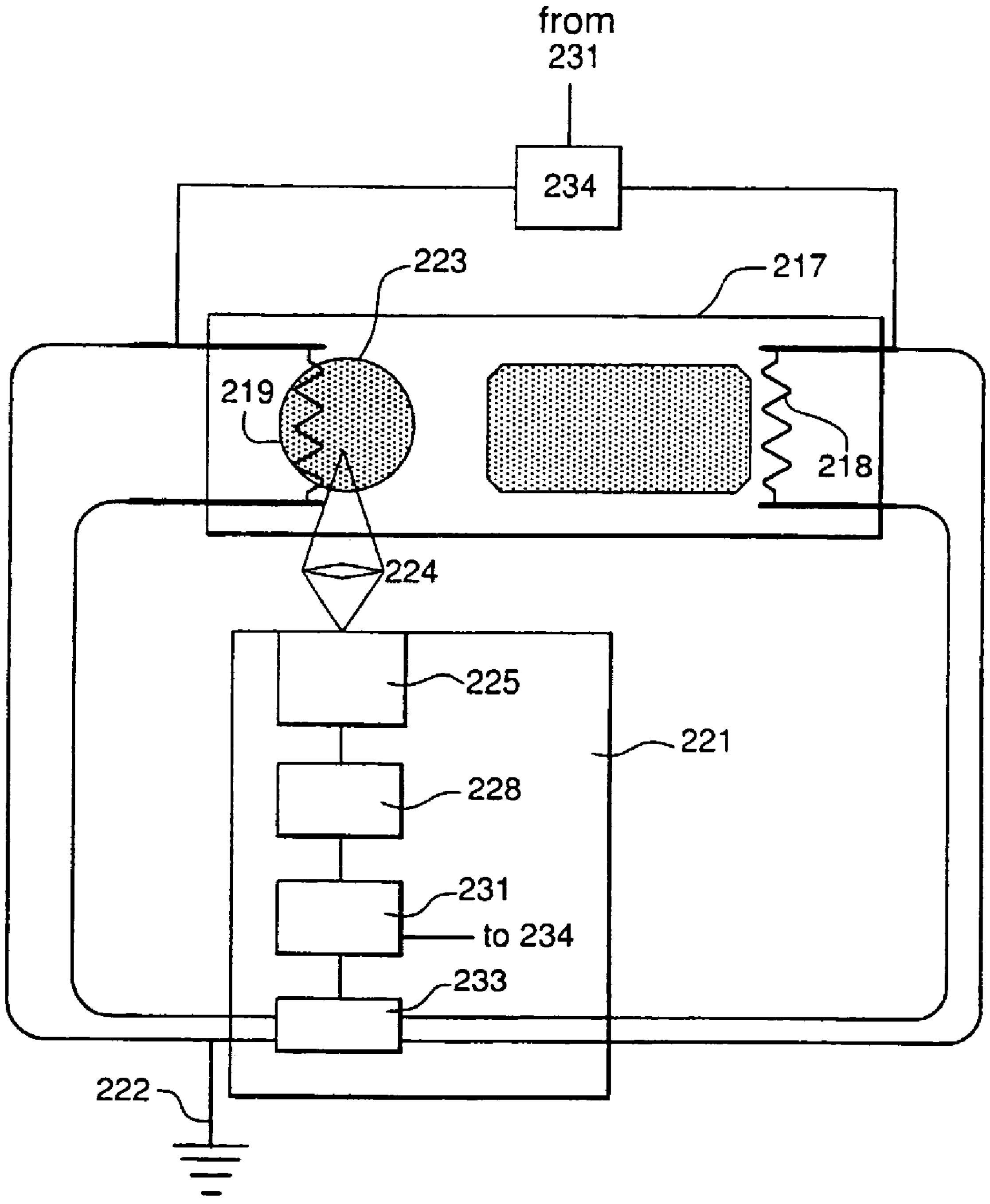
FIG. 26 is a block diagram of a smart ballast for dynamically controlling cathode-heater current based on discharge current.

As shown in FIG. 26, light from the negative glow 223 formed in proximity to the electrode 219 may be collected by an optical focusing element, such as a lens 224, which is focused on a radiation isolator 225. In general, the radiation isolator 225 may be any device capable of isolating radiation of a specific wavelength, specific wavelengths, or a specific range of wavelengths. For example, the radiation isolator 225 may be a spectrometer, a grating polychrometer, a filter, or a prism.

Radiation having the specified wavelength emerges from the radiation isolator 225 and may be detected by a radiation detector 228. In general, the radiation detector 228 may be any device that converts radiation intensity to a voltage with sufficiently quick time response. For example, the radiation detector 228 may be a photomultiplier tube or charge-coupled device.

The signal out of the radiation detector 228 may be provided to an input lead of a microprocessor 231. The microprocessor 231 may be programmed to cause a power supply 234 to deliver a discharge current, which may be of any frequency or waveform, to the lamp 217. The microprocessor 231 may also be programmed to cause a cathode-heater power supply 233 to apply to the electrodes 218 and 219 varying heater voltages based on the discharge current.

Initially, the microprocessor 231 may cause the cathode heater power supply 233 to apply a default voltage based on the discharge current. The default value of heater voltage may be lamp-specific, and may be determined using any of the techniques described above. During operation, the microprocessor 231 monitors the radiation emitted from the negative glow region 223 of the lamp 217. If the monitored radiation increases beyond a certain threshold, the microprocessor 231 causes the cathode-heater 234 to increase the cathode-heater voltage. Similarly, if the monitored radiation decreases beyond a certain threshold, the microprocessor 231 causes the cathode-heater 234 to decrease the cathode-heater voltage. Thus, the ballast 221 may be programmed to optimize heater-current as a function of discharge current.

As shown in FIG. 26, the microprocessor 231 may independently control first and second power supplies and, thus, may independently control cathode-heater voltage and discharge current. It should be understood that one or more microprocessors or other controllers may be provided for this purpose.

Figure 27:
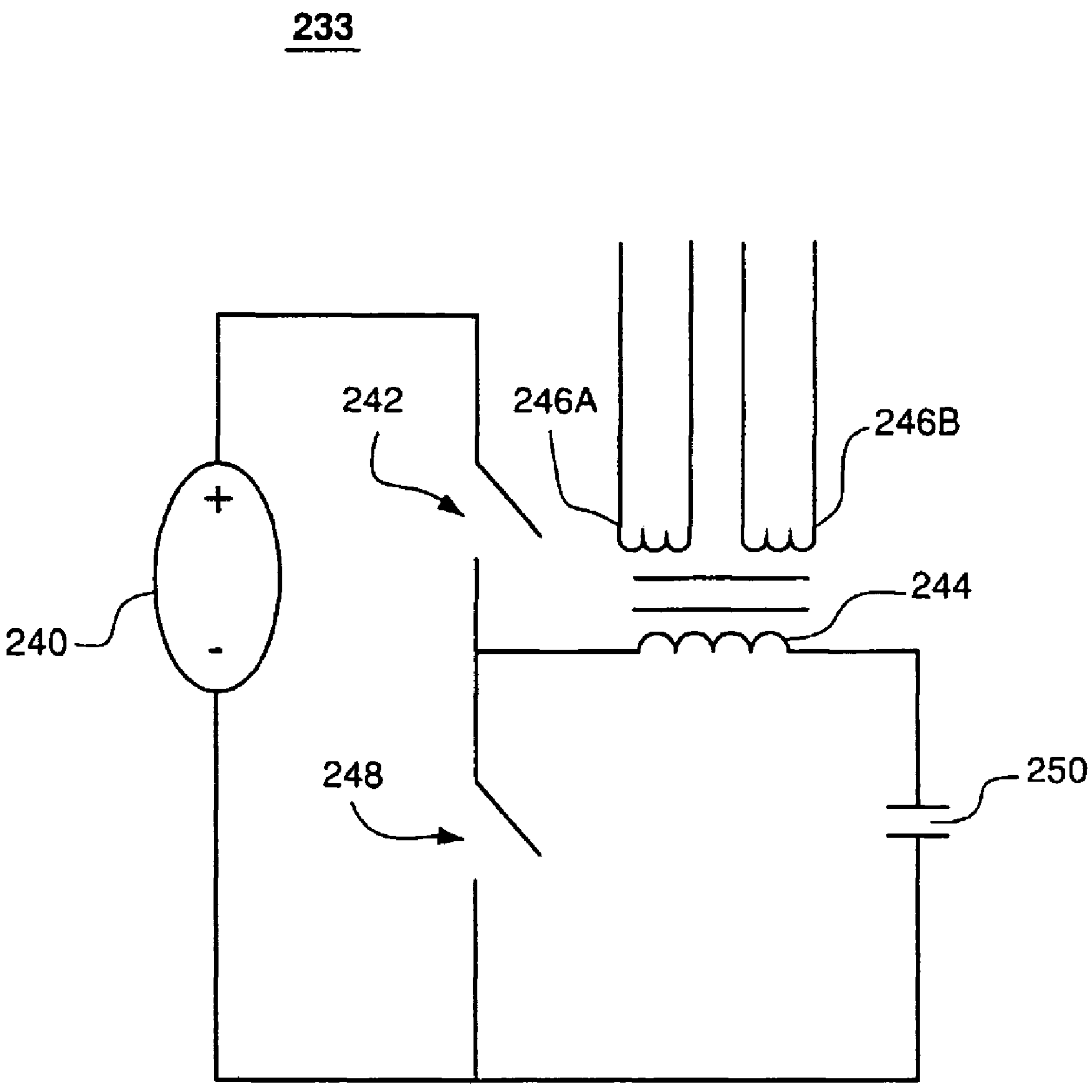
FIG. 27 provides an example embodiment of a cathode-heater according to the invention.

FIG. 27 provides an example embodiment of a cathode-heater 233 according to the invention for controlling cathode-heater voltage, $V_{fil}$, provided to the electrodes of a fluorescent lamp. A power supply 240 supplies electrical energy, via a switch 242 to a first inductive element, or coil, 244. Second and third inductive elements 246A and 246B may be electrically coupled to the filaments 218 and 219. A second switch 248 and a capacitor 250 may be provided to complete the circuit. Though FIGS. 26 and 27 depict a power supply that supplies power to both electrodes, it should be understood that separate power supplies could be provided so that the electrodes 218 and 219 may be controlled independently of one another.

The principles of the invention could also be applied to "audit" a lamp type for changes, such as filament changes. Lamp manufacturers do not always inform ballast designers of changes made to the designs of the lamps. The ballast designers who design a particular ballast for a particular lamp type may find that the ballast no longer works as effectively as possible because the lamp type has been changed. By occasionally testing the lamp type using apparatus and methods of the invention, a ballast designer can determine whether the functionality of a particular ballast should be modified because a lamp type has been changed.

Accordingly, a ballast designer could apply the principles of the invention to obtain respective plots of radiation intensity as a function of cathode heater voltage for first and second populations of lamps (e.g., old and new lamps). In each case, the heater voltage is identified that causes the radiation to "break." That is, the heater voltage is identified that causes the radiation intensity to fall such that, for example, it is determined that the cathode fall has dropped below 13.1 v. Then, for each population, the number of lamps in the population is plotted as a function of cathode heater voltage breakpoint. If the populations have different cathode heater breakpoints (e.g., if the populations have different average cathode heater breakpoints), then the ballast designer may wish to change the cathode heater profile for that lamp type.

A further advantage of the invention, from a lamp manufacturer's point of view, for example, is that of shortening the time required to design a cathode for a new lamp type. Currently, test cathodes must be fabricated, lamps made and life tested for extended periods of time to determine whether life performance is within specified limits. If not, one or more subsequent iterations of alternate designs must be carried out. By using a technique according to the invention, lamp/filament designs could be vetted for cathode fall without life testing. Thus, final designs having a desired cathode fall, cathode temperature, and coating weight may be arrived at much more quickly.

Similarly, a lamp designer could characterize a lamp type or filament type, without the need for life testing, by employing the principles of the invention. For example, a lamp designer could test a certain filament type to determine how it behaves under certain conditions. That is, the lamp designer could measure lamp performance data according to the invention for various filaments at various values of heater voltage, condensed mercury temperature, discharge current, etc. Such lamp performance data may then be published in connection with the lamp, such as by publication in a specification associated with the lamp (e.g., for warranty purposes).

Other modifications of these methods and of their application to the design of electronic ballasts for dimming fluorescent lamps will be readily apparent to one of ordinary skill in the art, but are included within the invention, which is limited only by the scope of the appended claims.

What is claimed is:

1. Apparatus for measuring cathode fall in a fluorescent lamp that contains an electrode and a gas, the apparatus comprising:

a radiation detector that receives radiation emitted from the gas, the received radiation having a pre-specified wavelength; and a display that provides a visual representation of an intensity of the received radiation, wherein the intensity of the received radiation corresponds to a level of cathode fall associated with the electrode.

2. Apparatus according to claim 1, further comprising a power supply that supplies a discharge current to the electrode.

3. Apparatus according to claim 1, further comprising a power supply that supplies a heating current to the electrode.

4. Apparatus according to claim 1, further comprising a radiation isolator that provides radiation having the pre-specified wavelength to the radiation detector.

5. Apparatus according to claim 4, wherein the radiation isolator is adapted to isolate radiation having a specific wavelength, radiation having at least one of a plurality of specific wavelengths, or radiation having a wavelength within a specific range of wavelengths.

6. Apparatus according to claim 4, wherein the radiation isolator is one of a spectrometer, a grating polychrometer, a filter, and a prism.

7. Apparatus according to claim 4, further comprising a radiation collector that collects radiation emitted from the gas and focuses the radiation onto the radiation isolator.

8. Apparatus according to claim 1, wherein the radiation detector is adapted to convert radiation intensity to a voltage and to supply the voltage to the display.

9. Apparatus according to claim 1, wherein the radiation detector is one of a photomultiplier tube and a charge-coupled device.

10. Apparatus according to claim 1, wherein an onset of emission of said radiation indicates that the cathode fall has exceeded an excitation potential that corresponds to the wavelength of the emitted radiation.

11. Apparatus according to claim 1, wherein an onset of emission of the radiation indicates that the cathode fall has exceeded an energy level associated with a metastable state of the gas.

12. Apparatus according to claim 1, wherein an onset of emission of the radiation indicates that the cathode fall has exceeded an energy level associated with a 4p state of the gas.

13. Apparatus according to claim 1, wherein an onset of emission of the radiation indicates that the cathode fall has exceeded an energy level associated with a 5p state of the gas.

14. Apparatus according to claim 1, wherein an onset of emission of the radiation indicates that the cathode fall has exceeded an energy level associated with a metastable state of the gas and that stepwise excitation to a 5p state of the gas is occurring.

15. Apparatus according to claim 1, wherein an onset of emission of the radiation indicates that the cathode fall has exceeded an energy level associated with a metastable state of the gas and that stepwise excitation to a 4p state of the gas is occurring.

16. Apparatus according to claim 1, wherein an onset of emission of the radiation indicates that the cathode fall has exceeded an energy level associated with a 4p state of the gas and that direct excitation to the 4p state is occurring.

17. Apparatus according to claim 1, wherein an onset of emission of the radiation indicates that the cathode fall has exceeded an energy level associated with a 5p state of the gas and that direct excitation to the 5p state is occurring.

18. Apparatus according to claim 1, wherein the gas includes at least one of helium, neon, argon, krypton, and xenon.

19. Apparatus according to claim 1, wherein the gas includes argon, and the radiation has a wavelength of at least one of about 420.0 nm and about 811.5 nm.

20. A method for measuring cathode fall in a fluorescent lamp that contains an electrode, the method comprising:

receiving radiation emitted from a negative glow formed proximate the electrode, the received radiation having a pre-specified wavelength; and displaying a visual representation of an intensity of the received radiation, wherein the intensity of the received radiation corresponds to a level of cathode fall associated with the electrode.

* * * * *